US006528826B2

(12) United States Patent
Yoshida et al.

(10) Patent No.: US 6,528,826 B2
(45) Date of Patent: Mar. 4, 2003

(54) DEPLETION TYPE MOS SEMICONDUCTOR DEVICE AND MOS POWER IC

(75) Inventors: Kazuhiko Yoshida, Nagano (JP); Motoi Kudoh, Nagano (JP); Tatsuhiko Fijihira, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/800,329

(22) Filed: Mar. 6, 2001

(65) Prior Publication Data

US 2001/0042886 A1 Nov. 22, 2001

Related U.S. Application Data

(63) Continuation of application No. 09/286,900, filed on Apr. 5, 1999, now Pat. No. 6,268,628.

(30) Foreign Application Priority Data

Apr. 3, 1998 (JP) .......................................... 10-091297

(51) Int. Cl.[7] .......................... H01L 29/94; H01L 31/62; H01L 29/74; H01L 31/111

(52) U.S. Cl. ....................... 257/147; 257/133; 257/139; 257/341; 438/279

(58) Field of Search ............................ 257/339, 342, 257/653, 41, 335, 133, 147, 341, 329; 438/215, 279–281, 331

(56) References Cited

U.S. PATENT DOCUMENTS

5,970,964 A 10/1999 Furuhata et al. ............ 123/644
5,990,518 A 11/1999 Kobayashi et al. ......... 257/341

FOREIGN PATENT DOCUMENTS

| JP | 2-192767 | 7/1990 |
| JP | 5-129598 | 5/1993 |
| JP | 6-232410 | 8/1994 |
| JP | 9-280147 | 10/1997 |

*Primary Examiner*—Matthew Smith
*Assistant Examiner*—Calvin Lee
(74) *Attorney, Agent, or Firm*—Rossi & Associates

(57) ABSTRACT

A depletion type MOS semiconductor device is provided which includes a $p^-$ well region formed in a surface layer of an $n^-$ drift layer, an $n^+$ emitter region formed in a surface layer of the $p^{31}$ well region, an $n^-$ depletion region formed in the surface layer of the $p^-$ well region, to extend from the $n^+$ emitter region to a surface layer of the $n^-$ drift layer, a gate electrode layer formed on a gate insulating film, over the $n^-$ depletion region, an emitter electrode formed in contact with surfaces of both of the $n^+$ emitter region and the $p^-$ well region, and a collector electrode formed on a rear surface of the $n^-$ drift layer. Also provided is a MOS power IC in which the depletion type MOS semiconductor device is integrated with a vertical MOSFET or IGBT. The MOS power IC has a high breakdown voltage, and includes a circuit for feeding back an increase in the potential of the C terminal to the gate ($g_m$) of the MOSFET or IGBT. Other examples of MOS power IC may include circuits suitable for high-speed turn-on or turn-off operations, and circuits for supplying power to an internal control circuit.

34 Claims, 16 Drawing Sheets

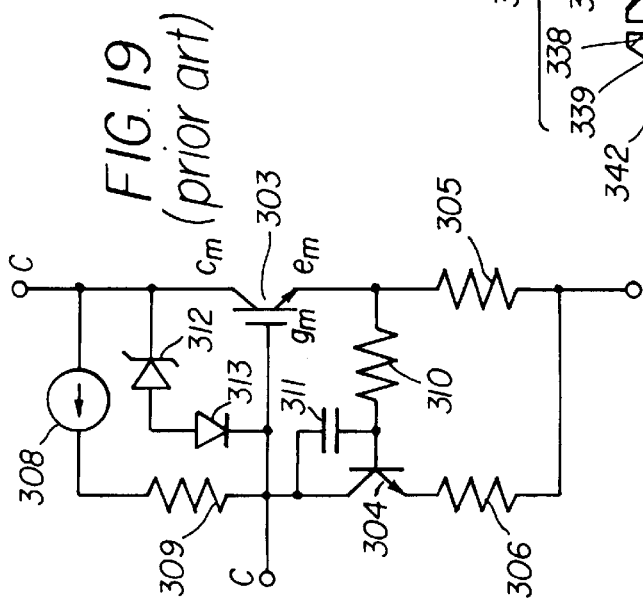
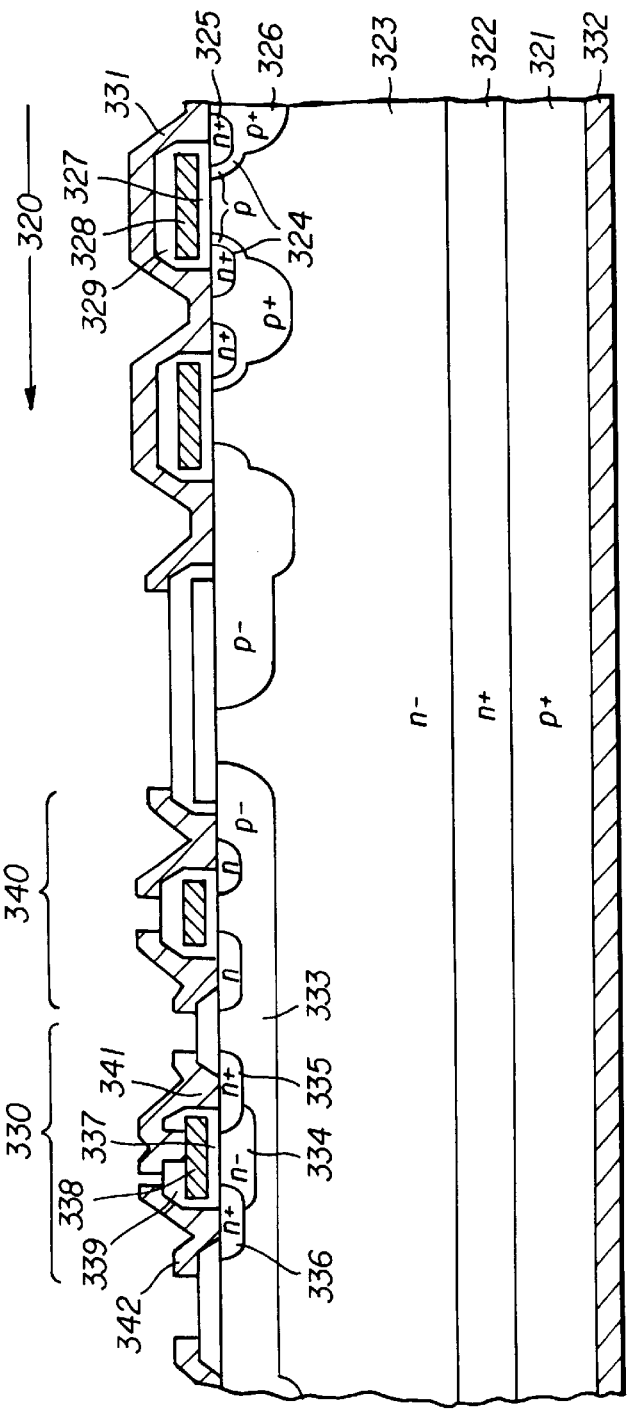
FIG. 19 (prior art)
FIG. 20 (prior art)

DEPLETION TYPE MOS SEMICONDUCTOR DEVICE AND MOS POWER IC

This is a Continuation of application Ser. No. 09/286,900 filed Apr. 5, 1999 now U.S. Pat. No. 6,268,628.

FIELD OF THE INVENTION

The present invention relates to depletion type MOS semiconductor devices that are suitably integrated with vertical MOSFET, and also relates to MOS power IC in which the depletion type MOS semiconductor devices are mounted, and a method of using the MOS power IC.

BACKGROUND OF THE INVENTION

Where a MOS semiconductor apparatus using a MOS semiconductor device, such as IGBT, as an output-stage semiconductor device is employed for use with an inductive load, such as an ignitor switching circuit (for intermitting current through the primary winding of an ignition coil of an automobile, for example), the IGBT suffers from oscillation of its collector voltage. To overcome this problem, the inventors of the present invention proposed that a branch of series-connected constant-current device and resistor be provided between the collector and gate of the output-stage IGBT, as disclosed in laid-open Japanese Patent Publication (Kokai) No. 9-280147.

FIG. 19 is a circuit diagram (FIG. 1 of JP-A-9-280147) showing the configuration of the MOS semiconductor apparatus disclosed in the above publication. One of its output terminals (C) is connected to a primary winding of an ignition coil that is not illustrated. A branch in which a constant-current device 308 and a resistor 309 are connected in series is provided between the collector ($c_m$) and gate ($g_m$) of an output-stage IGBT 303. FIG. 21 shows output characteristics of this MOS power IC, wherein the horizontal axis represents the collector voltage of the IGBT, and the vertical axis represents the collector current. It is to be particularly noted that an unsaturated region of the constant-current device 308 is utilized to provide a characteristic that the collector current increases with an increase in the collector voltage, thereby to suppress oscillation of the collector voltage. In the above-identified publication, it is suggested to use a depletion type MOSFET or IGBT as the constant-current device 308, and fabricate or build this device into a part of the output-stage IGBT 303, but there is no specific description of such an integrated structure. It is also stated in the above publication that the constant-current device 308 may be in the form of a series power supply.

FIG. 20 is a cross-sectional view of a part of IGBT with which a depletion type and an enhancement type MOSFETs are integrated. The right-hand side portion of FIG. 20 illustrates an output-stage IGBT 320 epitaxial wafer is generally used in which an $n^+$ buffer layer 322 and an $n^-$ drift layer 323 are laminated on a $p^-$ substrate 321, and a multiplicity of IGBT units are formed in a surface layer of the $n^-$ drift layer 323. On the left-hand side of FIG. 20, a depletion type MOSFET 340 is formed on and within a $p^-$ well region 333 that is formed in a surface layer of the $n^-$ drift layer 323. The middle portion of FIG. 20 illustrates an enhancement-type n-channel MOSFET formed on and within the p well region 333, which is not related to the principle of the present invention.

To provide the depletion MOSFET 330, an $n^-$ depletion region 334, $n^+$ source region 335 and an $n^+$ drain region 336 are formed in a surface layer of the $p^-$ well region 333, such that the $n^+$ source region 335 and $n^+$ drain region 336 are located on the opposite sides of the $n^-$ depletion region 334. A gate electrode layer 338 is formed above the $n^-$ depletion region 334 with a gate insulating film 337 interposed therebetween. Source electrode 341 and drain electrode 342 are formed in contact with the $n^+$ source region 335 and $n^+$ drain region 336, respectively, such that the source electrode 341 also contact with the gate electrode layer 338.

With the arrangement as shown in FIG. 20, the constant-current device in the form of the depletion MOSFET 330 can be integrated with the IGBT on the same chip. As is understood from FIG. 19, the breakdown voltage of the constant-current device 308 is desirably equivalent to that of the IGBT 303 since these devices have a common output terminal (C). It is, however, extremely difficult for the lateral MOSFET formed in the $p^-$ well region 333 as shown in FIG. 20, to achieve such a high breakdown voltage as several hundreds of voltage. Accordingly, the semiconductor apparatus having the circuit configuration of FIG. 19 must use a discrete high-voltage constant-current device or a power supply.

SUMMARY OF THE INVENTION

It is therefore an object of the present invention to provide a depletion type MOS semiconductor device that is suitably integrated with a vertical MOS type semiconductor apparatus, assuring a high breakdown voltage, and to provide a MOS power IC in which the depletion type MOS semiconductor device is mounted.

To accomplish the above object, the present invention provides a depletion type MOS semiconductor device which comprises: an $n^-$ drift layer; a $p^-$ well region formed in a surface layer of the $n^-$ drift layer; an $n^+$ emitter region formed in a surface layer of the $p^-$ well region; an $n^-$ depletion region formed in the surface layer of the $p^-$ well region, to extend from the $n^+$ emitter region to a surface layer of the $n^-$ drift layer; a gate electrode layer formed on a gate insulating film, over the $n^-$ depletion region; an emitter electrode formed in contact with surfaces of both the $n^1$ emitter region and the $p^-$ well region; and a collector electrode formed on a rear surface of the $n^-$ drift layer.

A $p^+$ collector layer may be formed on the rear surface of the $n^-$ drift layer, such that the collector electrode is held in contact with the $p^+$ collector layer.

The depletion type MOS semiconductor device constructed as described above is suitably integrated with a vertical MOSFET, or a vertical IGBT in which the collector electrode contacts with the $p^+$ collector layer, and exhibits a sufficiently high breakdown voltage that is equivalent to that of the MOSFET or IGBT.

In one preferred form of the invention, the $p^-$ well region is formed at a substantially middle portion thereof with an aperture, so as to surround the $n^-$ depletion region. With this arrangement, the entire area of the $n^-$ drift layer inside the aperture is occupied by depletion layers that spread from the $p^-$ well region, whereby the breakdown voltage of the device can be easily increased.

If a plurality of depletion type MOS semiconductor devices each constructed as described above are arranged in parallel with each other, the resulting MOS semiconductor apparatus provides a sufficiently large current capacity.

The $p^-$ well regions of the depletion type MOS semiconductor devices connected in parallel with each other may be connected with each other. In this case, the plural MOS semiconductor devices may be formed over a reduced area of the semiconductor substrate, as compared with the case where the individual devices are formed separately, and a common electrode may be used for these semiconductor devices.

A plurality of n⁻ depletion regions may be formed in the n⁻ drift layer surrounded by one p⁻ well region. The depletion type MOS semiconductor apparatus thus constructed also provides a large current capacity.

In another preferred form of the invention, the n⁻ drift layer surrounded by one p⁻ well region assumes a substantially rectangular shape, and the length x of the short side of the rectangular shape is not greater than two-thirds of the thickness of the n⁻ drift layer.

As will be understood from experiment results as indicated later, the breakdown voltage is undesirably reduced if the length x of the short side exceeds two-thirds of the thickness of the n⁻ drift layer, probably because depletion layers that spread from opposite p⁻ well regions will not be joined together.

The length x of the short side is preferably not small than one-sixth of the thickness of the n⁻ drift layer. If the length x is smaller than one-sixth of the thickness of the n⁻ drift layer, a series resistance similar to a junction type FET becomes excessively large, and the resultant device will not be suited for practical use.

In a further preferred form of the invention, a p⁻ isolation well region is formed adjacent to the p⁻ well region, in the surface layer of the n⁻ drift layer, such that the potential of the p⁻ well region is independent of that of the p⁻ isolation well region. With this arrangement, the potential of the p⁻ well region may be freely set to a desired level, independently of the potential of the p⁻ isolation well region.

In a still further preferred form of the invention, a p⁻ isolation well region is formed adjacent to the p⁻ well region, in the surface layer of the n⁻ drift layer, and an isolated gate electrode layer is formed on an insulating film, over a surface of the n⁻ drift layer between the p⁻ well region and the p⁻ isolation well region. With this arrangement, conduction between the p⁻ well region and the p⁻ isolation well region can be prevented by applying a certain voltage to the isolated gate electrode layer.

The isolation gate electrode layer preferably has a potential close to that of the emitter electrode, or has the same potential as the emitter electrode. In this case, conduction between the p⁻ well region and the adjacent p⁻ isolation well region can be prevented.

Furthermore, the emitter electrode may be connected to the gate electrode. In this case, the potential of the gate electrode becomes equal to that of the emitter electrode, thereby providing a constant-current characteristic.

A MOS power IC in which the depletion type MOS semiconductor device as described above is mounted is provided which comprises: an output-stage MOS semiconductor device including a control portion of a metal-oxide-semiconductor (MOS) structure that provides a main gate ($g_m$) as a control input port, a collector ($c_m$) as an output port, and a main emitter ($e_m$); first and second output terminals (C,E) connected to the collector ($c_m$) and the main emitter ($e_m$) of the output-stage semiconductor device; a control input terminal (G) connected to the main gate ($g_m$) of the output-stage semiconductor device; a depletion type MOS semiconductor device that is connected in series with a collector resistance (Rc), a branch including the depletion type MOS semiconductor device and the collector resistance (Rc) being provided between the first output terminal (C) and the control input terminal (G), such that a collector ($c_d$) of the depletion type MOS semiconductor device is connected to the C terminal.

In the MOS power IC constructed as described above, the output-stage MOS semiconductor device can be integrated with the depletion type MOS semiconductor device having substantially the same breakdown voltage as the output-stage MOS device, and the potential of the main gate ($g_m$) of the output-stage MOS semiconductor device can be increased with an increase in the potential of the output terminal (C).

In another form of the MOS power IC, a gate resistance ($R_{G1}$, $R_{G2}$) is connected between the main gate ($g_m$) of the output-stage MOS semiconductor device and the control input terminal (G), and the depletion type MOS semiconductor device is provided between the first output terminal (C) and one side of the gate resistance ($R_{G2}$) close to the main gate ($g_m$) of the gate resistance ($R_{G1}$), such that the collector ($c_d$) of the depletion type MOS semiconductor device is connected to the C terminal. In this MOS power IC, too, the output-stage MOS semiconductor device can be integrated with the depletion type MOS semiconductor device having substantially the same breakdown voltage as the output-stage MOS device, and the potential of the main gate ($g_m$) of the output-stage MOS semiconductor device can be increased with an increase in the potential of the output terminal (C).

In a further form of the MOS power IC, a gate resistance ($R_{G2}$) is connected between the main gate ($g_m$) of the output-stage MOS semiconductor device and the control input terminal (G), and a branch in which a depletion type MOS semiconductor device that is connected in series with a collector resistance ($R_{CG}$) is provided between the first output terminal (C) and the gate resistance ($R_{G2}$), such that the collector ($c_d$) of the depletion type MOS semiconductor device is connected to the output terminal (C).

In the MOS power IC as described above, too, the output-stage MOS semiconductor device can be integrated with the depletion type MOS semiconductor device having substantially the same breakdown voltage as the output-stage MOS device, and the potential of the main gate ($g_m$) of the output-stage MOS semiconductor device can be increased with an increase in the potential of the output terminal (C).

If the collector resistance ($R_{CG}$) is formed from a polysilicon layer that is insulated from a semiconductor substrate, the MOS power IC does not suffer from latch-up of a parasitic thyristor that would occur in the case where the collector resistance ($R_{CG}$) if formed in the semiconductor substrate.

In the MOS power IC as described above, a branch of series-connected sense MOS semiconductor device and resistance (Rs) may be further provided between the first and second output terminals (C,E), such that a sense collector ($c_s$) of the sense MOS semiconductor device is connected to the first output terminal (C), and a sense gate ($g_s$) of the sense MOS semiconductor device is connected to the control input terminal (G). With this arrangement, upon an increase in the potential of the output terminal (C), the potential of the main gate ($g_m$) of the output-stage MOS semiconductor device can be increased without increasing the potential of the gate ($g_s$) of the sense MOS semiconductor device. By separating the main gate ($g_m$) of the output-stage MOS semiconductor device from the sense gate ($g_s$) of the sense MOS semiconductor device, a phase delay of a control circuit system due to a large gate capacity of the output-stage MOS semiconductor device can be avoided, as disclosed in U.S. Pat. No. 5,621,601.

According to the present invention, there is provided a MOS power IC including the depletion type MOS semiconductor device as described above, which comprises: an output-stage MOS semiconductor device including a control portion of a metal-oxide-semiconductor (MOS) structure that provides a main gate ($g_m$) as a control input port, a collector ($c_m$) as an output port, and a main emitter ($e_m$); first and second output terminals (C,E) connected to the collector ($c_m$) and the main emitter ($e_m$) of the output-stage semiconductor device; a control input terminal (G) connected to the main gate ($g_m$) of the output-stage semiconductor device; an internal control circuit connected between the second output terminal (E) and the control input terminal (G); a turn-off circuit connected between the output terminal (E) and the main gate ($g_m$) of the output MOS semiconductor device; a gate resistance ($R_G$) connected between the main gate ($g_m$) of the output-stage MOS semiconductor device and the control input terminal (G); a depletion type MOS semiconductor device provided between the first output terminal (C) and the main gate ($g_m$) of the output-stage MOS semiconductor device, such that a collector ($c_d$) of the depletion type MOS semiconductor device is connected to the C terminal.

In another form of the MOS power IC, a branch including series-connected depletion type MOS semiconductor device and Zener diode ($Z_{D2}$) is provided between the first output terminal (C) and the main gate ($g_m$) of the output-stage MOS semiconductor device, such that the collector ($c_d$) of the depletion type MOS semiconductor device is connected to the first output terminal (C), and such that an anode of the Zener diode ($Z_{D2}$) is connected to the emitter ($e_d$) of the depletion type MOS semiconductor device as shown in FIG. 13.

In a further form of the MOS power IC, a branch in which a depletion type MOS semiconductor device, a Zener diode ($ZD_2$) and a resistance ($R_{CG}$) are connected in series is provided between the first output terminal (C) and the main gate ($g_m$) of the output-stage MOS semiconductor device, such that the collector ($c_d$) of the depletion type MOS semiconductor device is connected to the first output terminal (C), and such that the anode of the Zener diode ($AD_2$) is connected to the emitter ($e_d$) of the depletion type MOS semiconductor device.

In the above forms of MOS power IC, charger can be injected from the collector ($c_d$) of the depletion type MOS semiconductor device into the main gate ($g_m$) of the output-stage MOS semiconductor device, with small impedance due to (the presence of) the gate resistance ($R_G$), and therefore the turn-on speed can be increased.

In particular, if the resistance ($R_{CG}$), resistance ($R_G$), and the Zener diode ($ZD_2$) are formed from polysilicon layers that are insulated from the semiconductor substrate, the resulting MOS power IC will not suffer from latch-up of a parasitic thyristor that would occur in the case where these resistances and Zener diode are formed in the semiconductor substrate.

The MOS power IC as described above may further include a Zener diode ($ZD_l$) which is arranged in parallel with the gate resistance ($R_G$), and includes a cathode electrode connected to the control input terminal (G), and an anode electrode connected to the main gate ($g_m$) of the output-stage semiconductor device. With this arrangement, charges can be readily or promptly discharged from the main gate ($g_m$) of the output-stage MOS semiconductor device when it is turned off, and the turn-off time can be reduced.

The MOS power IC as described above may further include a branch in which a Zener diode ($ZD_l$) and a resistance ($R_Z$) are connected in series, which branch is provided in parallel with the gate resistance ($R_G$), such that the anode electrode of the Zener diode ($ZD_l$) is connected to the control input terminal (G), and the cathode electrode is connected to the main gate ($g_m$) of the output-stage semiconductor device. With this arrangement, charges can be promptly discharged from the main gate ($g_m$) of the output-stage MOS semiconductor device when it is turned off, and the turn-off time can be reduced. In addition, the turn-off speed can be adjusted by use of the resistance ($R_Z$).

If the resistance ($R_Z$) and the Zener diode ($ZD_l$) are formed from polysilicon layers that are insulated from a semiconductor substrate, the MOS power IC does not suffer from latch-up of a parasitic thyristor that would occur when these resistance and Zener diode are formed in the semiconductor substrate.

According to the present invention, there is also provided a MOS power IC including the depletion type MOS semiconductor device as described above, which comprises: an output-stage MOS semiconductor device including a control portion of a metal-oxide-semiconductor (MOS) structure that provides a main gate ($g_m$) as a control input port, a collector ($c_m$) as an output port, and a main emitter ($e_m$); first and second output terminals (C,E) connected to the collector ($c_m$) and the main emitter ($e_m$) of the output-stage semiconductor device; a control input terminal (G) connected to the main gate ($g_m$) of the output-stage semiconductor device; a turn-off circuit connected between the output terminal (E) and the main gate ($g_m$) of the output MOS semiconductor device; a gate resistance ($R_G$) connected between the main gate ($g_m$) of the output-stage MOS semiconductor device and the control input terminal (G); a depletion type MOS semiconductor device including a collector ($c_d$) connected to the first output terminal (C), and an emitter ($e_d$) connected to a circuit power supply terminal ($V_{DD}$) of an internal control circuit. In another form of the MOS power IC, the collector ($c_d$) of the depletion type MOS semiconductor device is connected to the first output terminal (C), and the emitter ($e_d$) is connected to the cathode electrode of a Zener diode ($ZD_3$), while the anode electrode of the Zener diode ($ZD_3$) is connected to the circuit power supply terminal ($V_{DD}$) of the internal control circuit as shown in FIG. 15.

In the MOS power ICs as described above, a separate power supply circuit for the internal control circuit need not be provided since power is constantly supplied from the C terminal to the internal control circuit. In the MOS power IC provided with the Zener diode ($ZD_4$), in particular, the leakage current can be prevented when the potential of the control input terminal (G) becomes higher than that of the first output terminal (C).

If the Zener diode ($ZD_4$) is formed from a polysilicon layer that is insulated from the semiconductor substrate, the MOS power IC does not suffer from latch-up of a parasitic thyristor that would occur if the Zener diode is formed in the semiconductor substrate.

The MOS power IC may further includes a Zener diode ($AD_3$) having an anode electrode connected to the control input terminal (G), and a cathode electrode connected to the circuit power supply terminal ($V_{DD}$) of the internal control circuit. With this arrangement, leakage current can be prevented when the potential of the first output terminal (C) becomes higher than that of the control input terminal (G).

In this case, if the Zener diode ($ZD_4$) is formed from a polysilicon layer that is insulated from the semiconductor substrate, the MOS power IC does not suffer form latch-up of a parasitic thyristor that would occur in the case where the Zener diode is formed in the semiconductor substrate.

According to the present invention, there is also provided a MOS power IC including the depletion type MOS semiconductor device as described above, which comprise: an output-stage MOS semiconductor device including a control portion of a metal-oxide-semiconductor (MOS) structure that provides a main gate ($g_m$) as a control input port, a collector ($c_m$) as an output port, and a main emitter ($e_m$); first and second output terminals (C,E) connected to the collector ($c_m$) and the main emitter ($e_m$) of the output-stage semiconductor device; a control input terminal (G) connected to the main gate ($g_m$) of the output-stage semiconductor device; an internal control circuit connected between the second output terminal (E) and the control input terminal (G), the internal control circuit including a voltage comparing terminal ($V_K$); a turn-off circuit connected between the second output terminal (E) and the main gate ($g_m$) of the output MOS semiconductor device; a gate resistance ($R_G$) connected between the main gate ($g_m$) of the output-stage MOS semiconductor device and the control input terminal (G); and a depletion type MOS semiconductor device including a collector ($c_d$) connected to the first output terminal (C), and an emitter ($e_d$) connected to the voltage comparing terminal ($V_K$) of the internal control circuit. In another example, the collector ($c_d$) of the depletion type MOS semiconductor device may be connected to the first output terminal (C), and the emitter ($e_d$) of the same device may be connected to the anode of a Zener diode ($ZD_5$), while the cathode of the Zener diode ($ZD_5$) is connected to the voltage comparing terminal of the internal control circuit as shown in FIG. 16.

In the MOS power IC as described above, since the potential of the substrate can be detected by the internal control circuit serving as a comparator, and constant current is produced when the substrate potential is high, steady-state loss can be reduced as compared with the conventional arrangement using a resistance and a Zener diode. In the MOS power IC provided with the Zener diode ($ZD_5$), in particular, leakage current can be prevented when the potential of the voltage comparing terminal of the internal control circuit becomes higher than that of the first output terminal (C).

If the Zener diode ($ZD_5$) is formed from a polysilicon layer that is insulated from the semiconductor substrate, the MOS power IC does not suffer form latch-up of a parasitic thyristor that would occur in the case where the Zener diode is formed in the semiconductor substrate.

Preferably, the current density of the depletion type MOS semiconductor device surrounded by the $p^-$ well region does not exceed that of the output-stage MOS semiconductor device.

If current flows with a high current density through the depletion type MOS semiconductor device, a potential difference arises within the $n^-$ depletion region and $p^-$ well region, resulting in latch-up of a parasitic thyristor, and a rapidly reduced breakdown voltage.

BRIEF DESCRIPTION OF THE DRAWINGS

The invention will be described in greater detail with reference to preferred embodiments thereof and the accompanying drawings, wherein:

FIG. 3(a) through FIG. 3(c) are views relating to the depletion type IGBT, wherein FIG. 3(a) is a plan view of the depletion IGBT, FIG. 3(b) is a cross-sectional view useful in explaining the operation of the IGBT, and FIG. 3(c) is a graph showing current-voltage characteristics of the IGBT;

FIG. 19 is a circuit diagram of a conventional MOS power IC in which a constant-current device is mounted;

FIG. 20 is a cross-sectional view of a part of the conventional MOS power IC;

DETAILED DESCRIPTION OF THE PREFERRED EMBODIMENTS

Some preferred embodiments of the present invention will be described in detail with reference to the drawings. In the following description, n and p prefixed to regions, layers, and the like, mean that majority carriers in these regions and layers are electrons and holes, respectively, and + and − that follow n or p mean relatively high concentration and low concentration of impurities, respectively.

First Embodiment

Figure 2:
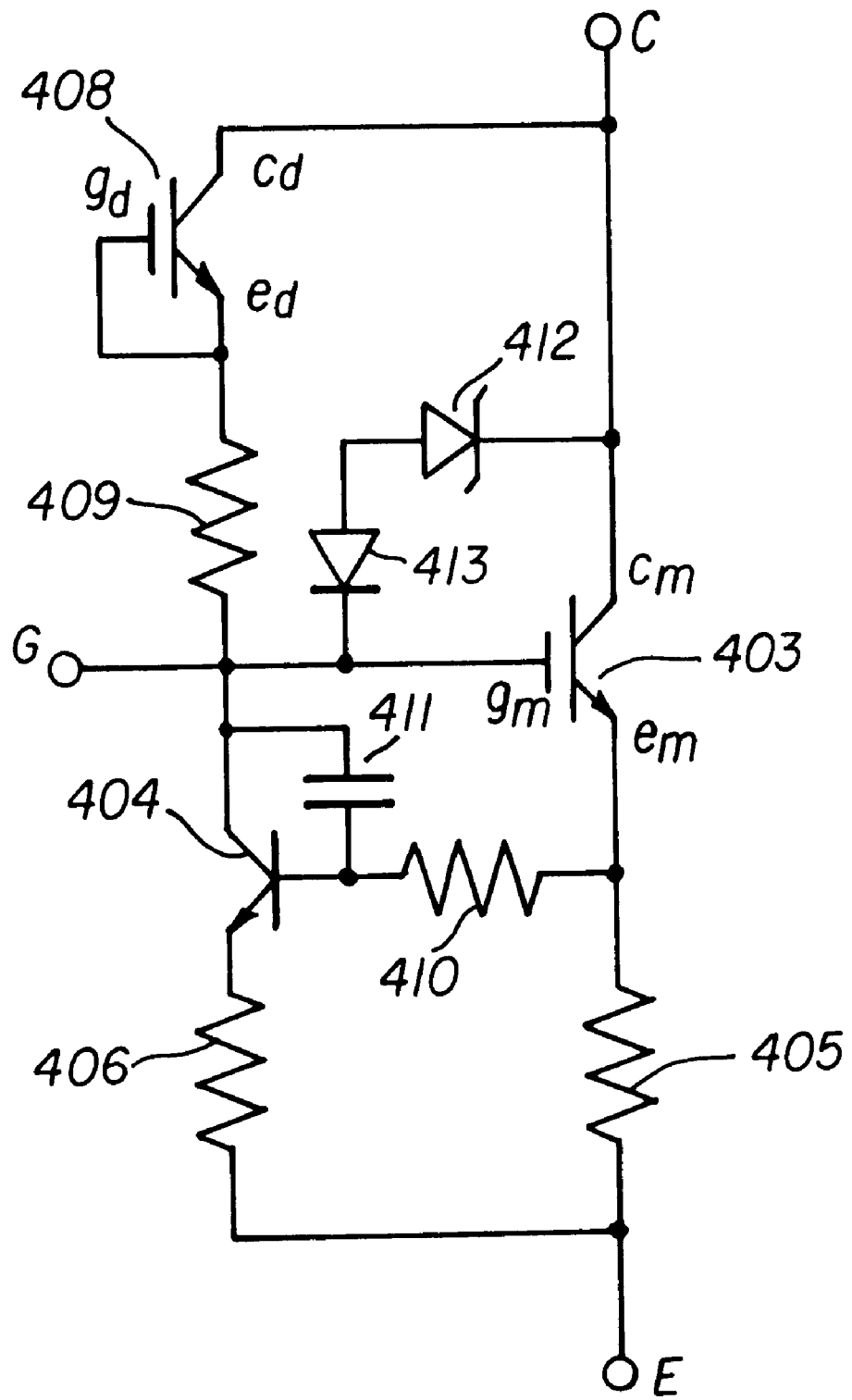
FIG. 2 is a circuit diagram showing the MOS power IC in which the depletion type MOS semiconductor device of the first embodiment of the invention is mounted.

FIG. 2 is a circuit diagram showing the configuration of a MOS power IC in which a depletion type MOS semiconductor device according to the present invention is mounted. This MOS power IC may be used for ignition of an ignitor of an internal combustion engine, for example. The MOS power IC includes an IGBT 403 having a gate of MOS structure, as an output-stage semiconductor device, and has two output terminals, i.e., a collector terminal (hereinafter referred to as "C terminal") and an emitter terminal (hereinafter referred to as "E terminal"), and a control input terminal (hereinafter referred to as "G terminal"). The output-stage IGBT 403 has a collector ($c_m$ connected to the C terminal, a main emitter ($e_m$) connected to the E terminal, and a main gate ($g_m$) connected to the G terminal. Between the C terminal and the G terminal, there is provided a branch in which a depletion type IGBT 408 that provides a constant-current device and a resistor 409 are connected in series. The collector ($c_d$) of the depletion type IGBT 408, as well as the collector ($c_m$) of the output-stage IGBT 403, is connected to the C terminal, and the emitter ($e_d$) of the IGBT 408 is connected to the G terminal through the resistor 409. The gate ($g_d$) of the depletion IGBT 408 is shorted to the emitter ($e_d$). A transistor 404 and a resistor 406 are connected in series between the G terminal and the E terminal. A resistor 410 is connected between the main emitter ($e_m$) of the output-stage IGBT 403 and the base of the transistor 404, and a resistor 405 is connected between the main emitter ($e_m$) and the E terminal. A capacitor 411 is connected between the collector and base of the transistor 404. The E terminal is grounded, and a drive circuit is connected to the G terminal, while the primary winding of the ignition coil is connected to the C terminal. While the output-stage IGBT 403 is turned on and off according to a signal applied to the G terminal, a high voltage that is induced in the ignitor coil upon turn-on of the IGBT 403 is used for the ignition circuit. The transistor 404 serves to shunt the current through the output-stage IGBT, based on a voltage drop across the resistor 405, and thus performs a so-called current limiting operation. A branch including a Zener diode 412 serves to prevent over-voltage from appearing between the G terminal and the C terminal.

Figure 1:
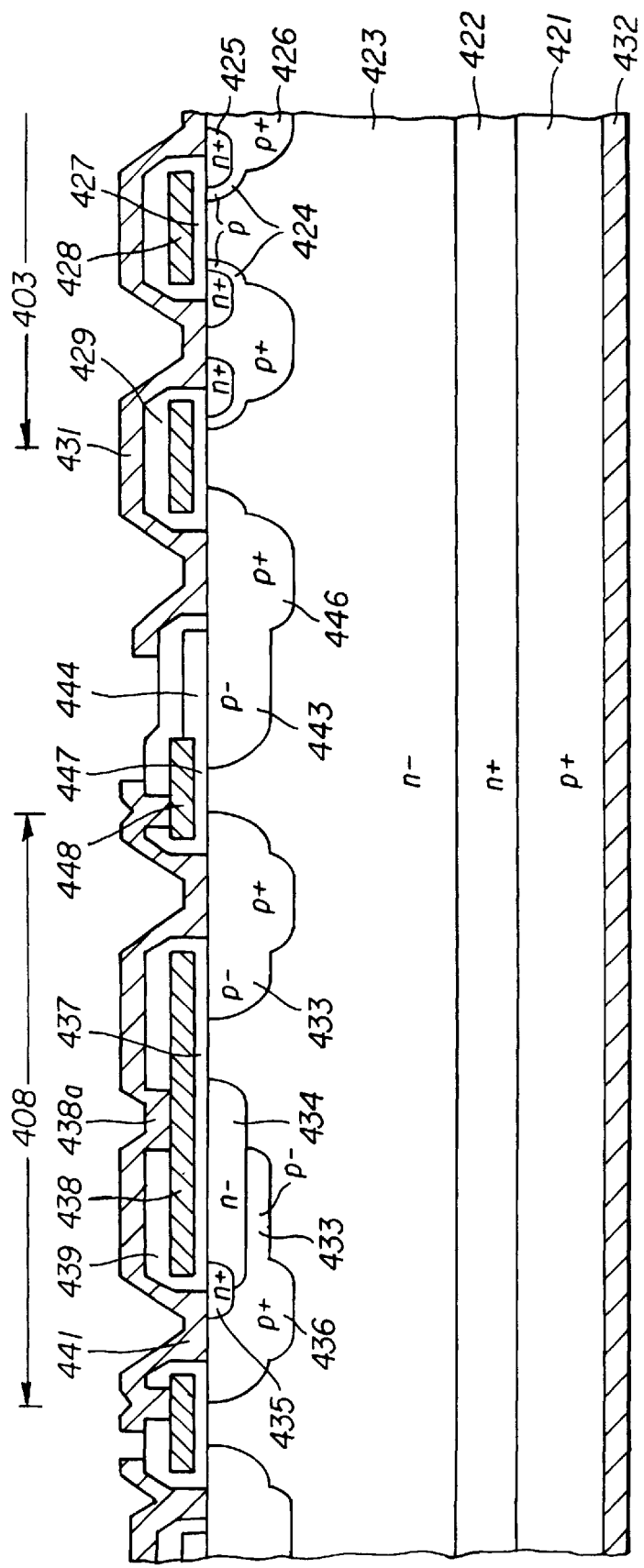
FIG. 1 is a cross-sectional view of a part of a MOS power IC in which a depletion type MOS semiconductor device as the first embodiment of the present invention is mounted.

FIG. 1 is a cross-sectional view of a part of the MOS power IC in which the circuit of FIG. 2 is built in the same chip, wherein the output-stage IGBT 403 and the depletion IGBT 408 are illustrated. The right-hand side portion of FIG. 1 illustrates the output-stage IGBT 403 that performs a switching function by conducting or cutting off the main current. As in the known example of FIG. 20, an $n^-$ drift layer 423 is laminated on an $n^+$ buffer layer 422 that is formed on a $p^+$ collector layer 421, and p base regions 424 and $p^+$ main well regions 426 having a large diffusion depth and formed as part of the p base regions 424 are formed in selected portions of a surface layer of the $n^-$ drift layer 423. Also, $n^+$ emitter regions 425 are formed in selected portions of the surface layers of the p base regions 424. A gate electrode layer 428 made of polysilicon is formed on a gate oxide film 427, over surfaces of the p base regions 424 interposed between the $n^-$ drift layer 423 and the $n^1$ main emitter regions 425. The output-stage IGBT further includes a main emitter electrode 431 that contacts with surfaces of both of the $n^1$ main emitter regions 425 and p base regions 424, and is connected to the E terminal, and a collector electrode 432 that is formed on the rear surface of the $p^1$ collector layer 421 is connected to the C terminal. Although not illustrated in FIG. 1, a main gate electrode (made of a metal) is formed in contact with the main gate electrode layer 428. The output-stage IGBT thus constructed operates in the same manner as conventional IGBTs. When a positive voltage is applied to the gate electrode, an inversion layer is induced in the surface layer of each p base region 424 located right under the gate electrode layer 428, and electrons are injected from the $n^+$ main emitter regions 425 into the $p^1$ collector layer 421, through the $n^-$ drift layer 423 and the $n^1$ buffer layer 422, to cause multiplication of carriers and thus turn on the output-stage IGBT 403. When the voltage to the gate electrode is removed, the injection of electrons is stopped, and the output-stage IGBT 403 is turned off.

The $n^+$ buffer layer 422 and $n^-$ drift layer 423 of the IGBT as described above may be formed by epitaxial growth on a substrate that provides the $p^+$ collector 421. As shown in FIG. 1, the main emitter electrode 431 may be extended over the main gate electrode layer 428 with a main insulating film 429 interposed therebetween.

As shown in the left-hand side portion of FIG. 1, a $p^-$ well region 433 is formed in the surface layer of the $n^-$ drift layer 423, and the depletion IGBT 408 is formed within and one the $p^-$ well region 433. The depletion IGBT 408 is a vertical device, whereas the known depletion type MOSFET 330 as shown in FIG. 20 is a lateral device. Namely, the depletion IGBT 408 shares the $p^+$ collector layer 421, $n^+$ buffer layer 422, and the $n^-$ drift layer 423 with the output-stage IGBT 403. To provide the depletion type IGBT 408, a $p^-$ well region 433 and a $p^+$ well region 436 formed as a part of the region 433 and having a large diffusion depth are formed in the surface layer of the $n^-$ drift layer 423, and an $n^+$ emitter region 435 is formed in a selected portion of the surface layer of the $p^-$ well region 433. Further, an $n^-$ depletion region 434 is formed in the surface layer of the $p^-$ well region 433 to extend from the $n^-$ emitter region 435 to the exposed portion of the $n^-$ drift layer 423, and a gate electrode layer 438 made of polysilicon is formed on a gate oxide film 437, over the surface of the exposed portion of the $n^-$ drift layer 423. Also, an emitter electrode 441 is formed in contact with surfaces of both of the $n^-$ emitter region 435 and the $p^-$ well region 433. The emitter electrode 441 is connected to a gate electrode 438a that is formed in contact with the gate electrode layer 438. The $p^1$ well region 436 functions to reduce contact resistance with the emitter electrode 441, and reduce base resistance of the $p^-$ well region 433, and may be formed at the same time that the $p^-$ main well regions 426 of the output-stage IGBT 403 are formed.

A $p^-$ isolation region 443 and a $p^+$ isolation well region 446 formed as part of the region 443 and having a large diffusion depth are formed in a surface layer of the $n^-$ drift layer 423 that is located outside the $p^-$ well region 433. The main emitter electrode 431 is held in contact with the surface of the $p^-$ isolation region 443. Upon turn-off, the $p^-$ isolation region 443 serves to draw out or remove holes in the $n^-$ drift layer 423 in a boundary portion between the output-stage IGBT 403 and the depletion IGBT 408. Also, an isolation gate electrode layer 448 is formed on an isolation gate oxide film 447, over the surface of the $n^-$ drift layer 423 interposed between the $p^-$ well region 433 and the $p^-$ isolation region 443. The emitter electrode 441 is held in contact with the isolation gate electrode layer 448. This arrangement will be described in detail later.

To provide a wafer to be used as a semiconductor substrate, an n-type layer (that provides the $n^+$ buffer layer 422) having a resistivity of 0.4Ω·cm and a thickness of 30 μm is epitaxially grown on a $p^+$ collector layer 421 having a resistivity of 0.01Ω·cm and a thickness of 500 μm, and an n-type layer (that provides the $n^-$ drift layer 423) having a resistivity of 25Ω·cm and a thickness of 40 μm is laminated on the $n^+$ buffer layer 422. The rest of the structure may be produced by almost the same process as used for producing known IGBT, with an addition of some processes. The p base regions 424, $p^+$ main well regions 426, $p^+$ well region 436, $p^-$ well region 433 of the depletion IGBT 408 and other p type regions are formed by implantation of boron ions and thermal diffusion, and the n+ main emitter regions 425, n+ emitter region 435, n− depletion region 434, and other n type regions are formed by implantation of arsenic ions or phosphorous ions, and thermal diffusion. The p base regions 424 and the n+ main emitter regions 425 are formed by using the main gate electrode layer 428 as part of masks, so that the edges of these regions 424, 425 are positioned as desired, and the widths of these regions 424, 425 are determined by lateral diffusion of the respective ions. The main emitter electrode 431, emitter electrode 441 and the gate electrode 438a are formed by sputtering of Al alloy and subsequent photolithography, and the collector electrode 432 is formed by depositing three layers of Ti, Ni and Au by sputtering, so as to be soldered to a metallic substrate.

The dimensions of the respective regions and layers may be determined as follows; the diffusion depth of the p+ main well region 426 and p+ well region 436 is 6 $\mu$m, and the diffusion depth of the p base region 424 and the p− well region 433 is about 2 $\mu$m. The diffusion depth of the n− depletion region 434 is 0.5 $\mu$m, and the diffusion depth of the n+ main emitter region 425 and n+ emitter region 435 is 0.4 $\mu$m. The thickness of the main gate oxide film 427 is 25 nm, and the thickness of the main gate electrode layer 428 made of polysilicon is 1 $\mu$m, while the thickness of the main emitter electrode 431 is about 3 $\mu$m.

Figure 3A:
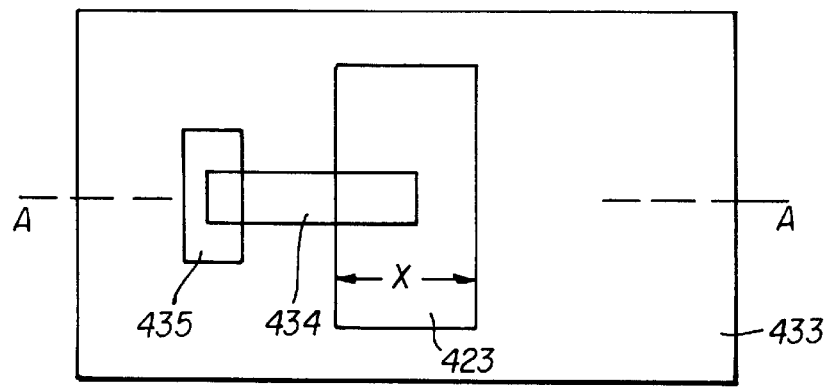

FIG. 3(a) is a plan view showing the depletion IGBT 408. The other portion of the MOS power IC is identical with that of FIG. 1. As shown in FIG. 3(a), the p− well region 433 having a rectangular aperture formed in a substantially middle portion thereof is formed in the surface layer of the n− drift layer 423, the n+ emitter region 435 is formed in the surface layer of the p− well region 433, and the n− depletion region 434 is formed in a region that extends from the n+ emitter region 436 to the exposed portion of the n− drift layer 423 that is surrounded by the p− well region 433.

Figure 3B:
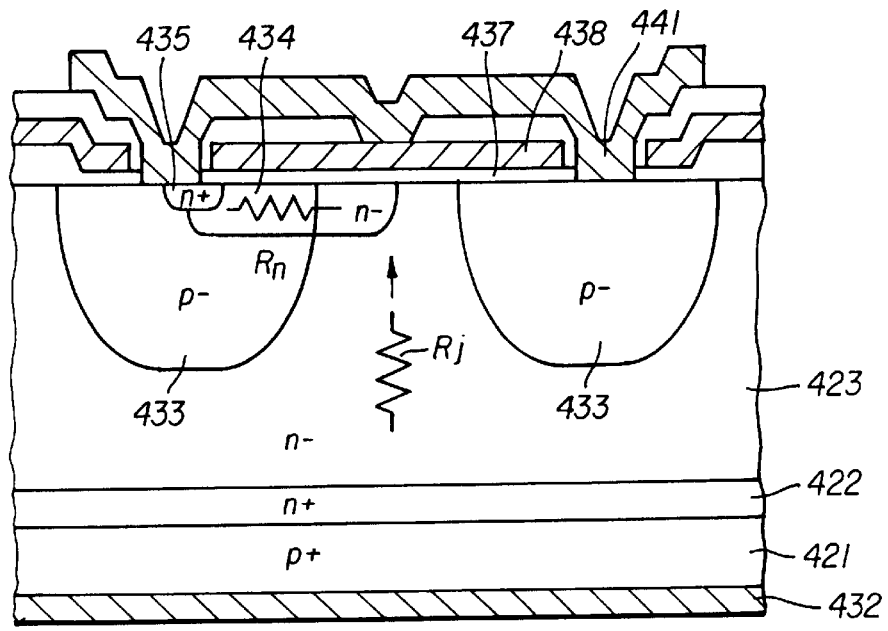

FIG. 3(b) is a cross-sectional view taken along line A—A of FIG. 3(a), which is useful in explaining the operation of the depletion IGBT 408. The p+ well region formed as a part of the p− well region 433 and having a large diffusion depth is omitted in this figure.

When a voltage that is higher on the side of the collector electrode 432 is applied between the collector electrode 432 and the emitter electrode 441, current flows from the p+ collector layer 421 to the emitter electrode 441, through the n+ buffer layer 422, n− drift layer 423, n− depletion region 434, and the n+ emitter region 435. The series resistance in the current path is the sum of a resistance (Rj) similar to a junction type FET, which appears in the n− drift layer 423 interposed between the opposite p− well regions 433, and a resistance (Rn) of the n− depletion region 434. Although there is a resistance of an accumulation layer that is induced in a surface layer of the n− drift layer 423 below the gate electrode layer 428, this resistance is smaller than the above-described resistances. Furthermore, an external resistor may be added as part of the series resistance.

Figure 3C:
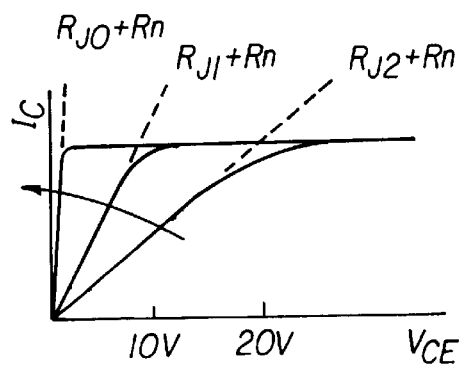

FIG. 3(c) is a graph showing current-voltage characteristics of the depletion IGBT 408, wherein the horizontal axis represents collector-emitter voltage, and the vertical axis represents collector current, while the series resistance is taken as a parameter. In the presence of the series resistance, the current through the depletion IGBT 408 linearly increases with an increase in the voltage, and then becomes constant, thus showing a constant-current characteristic. The voltage at which the depletion IGBT 408 enters the constant-current region may be changed depending upon the magnitude of the series resistance.

When a voltage that is lower on the side of the collector electrode 432 is applied between the collector electrode 432 and the emitter electrode 441, then n− depletion region 434 is depleted, and no current flows. As the negative voltage further increases, depletion layers that spread from the opposite p− well region 433 are joined together, thus enabling the device to withstand a considerably high voltage.

Figure 4A:
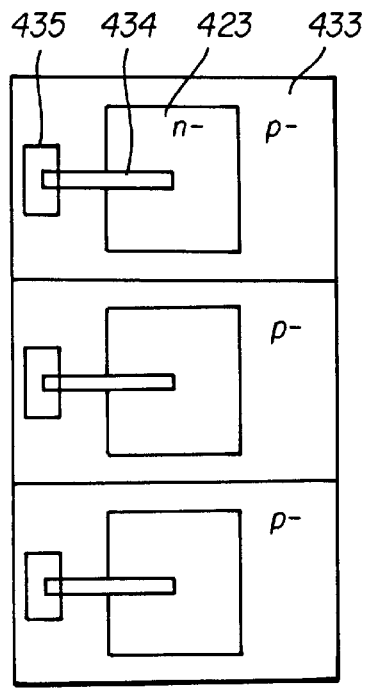
FIGS. 4(a) and 4(b) are plan views each showing a plurality of depletion type IGBTs that are arranged in parallel with each other.
Figure 4B:
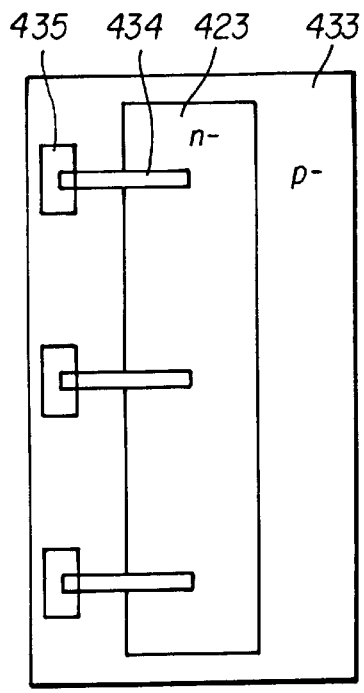

FIGS. 4(a) and 4(b) are plan views of modified examples of depletion type IGBT. The other portion of the MOS power IC is identical with that of FIG. 1. In FIG. 4(a), three unit cells of depletion IGBT are arranged and connected in parallel with each other, so as to provide a depletion type IGBT having a triple current capacity. In FIG. 4(b), those portions of the p− well region 433 that are interposed between the exposed portions of the n− drift layer 423 are omitted from the IGBT of FIG. 4(a). In this case, too, the current capacity of the resulting depletion type IGBT is about three times as large as that of FIG. 3(a).

Figure 5A:
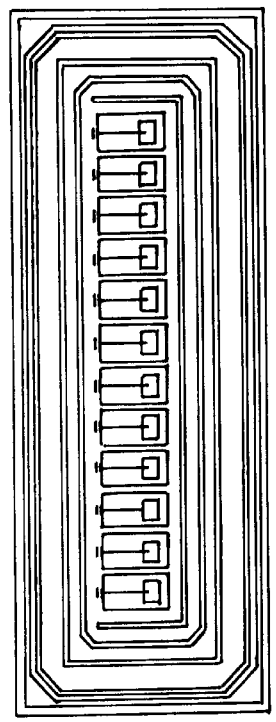
FIGS. 5(a) and 5(b) are plan views each showing depletion IGBT of a MOS power IC that was actually fabricated.
Figure 5B:
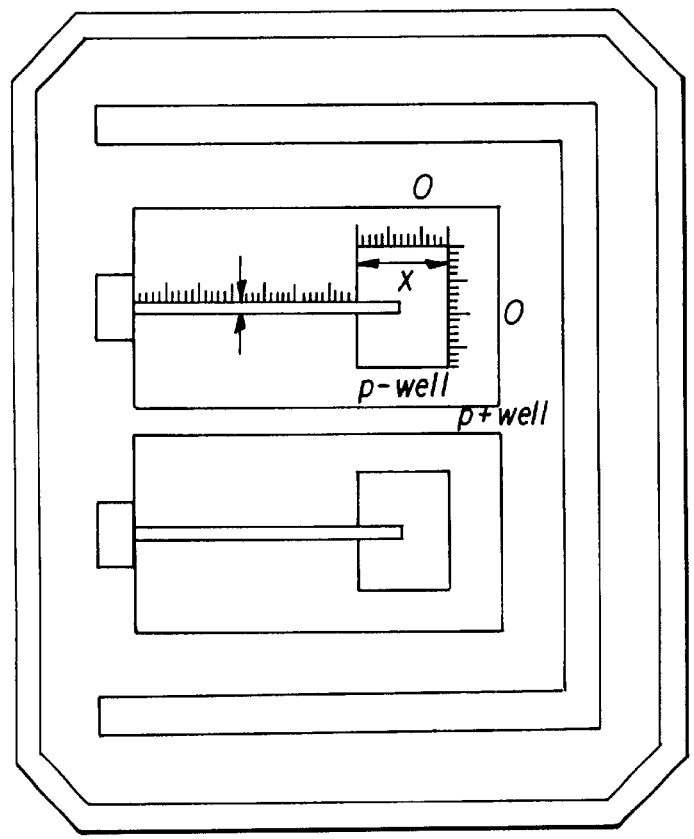

FIGS. 5(a) and 5(b) are plan views of depletion type IGBTs used for actual MOS power ICs. The other portion of the MOS power IC is identical with that of FIG. 1. In the example of FIG. 5(a), twelve unit cells of depletion type IGBT are arranged in parallel with each other. In the example of FIG. 5(b), two unit cells of depletion type IGBT are arranged in parallel with each other.

Figure 6:
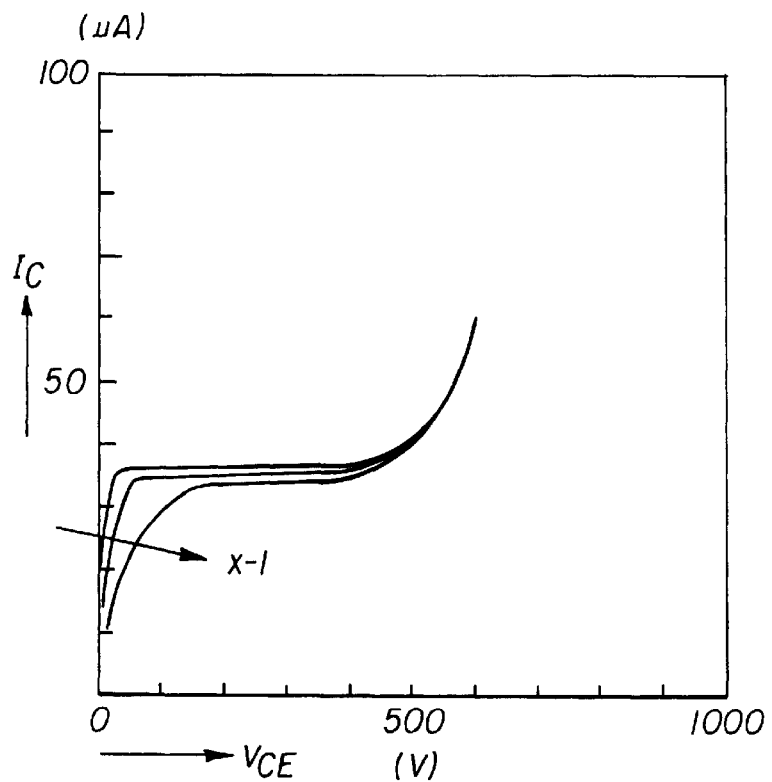
FIG. 6 is a graph showing current-voltage characteristics of the depletion type IGBT of FIG. 5(b)

FIG. 6 is a graph showing current-voltage characteristics of the depletion type IGBT of FIG. 5(b), wherein the horizontal axis represents collector-emitter voltage, and the vertical axis represents collector current. Three different characteristic lines were obtained by changing the length x ($\mu$m) of the short side of the rectangular exposed region of the n− drift layer that is surrounded by the p− well region.

As is understood from FIG. 6, the voltage at which the depletion type IGBT enters a constant-current region is increased with a decrease in the length x. This is because the resistance component (Rj) similar to a junction type FET as described above increases as the length x is reduced. The depletion type IGBT of FIG. 5(b) is able to withstand such a high voltage as about 600V.

Figure 21:
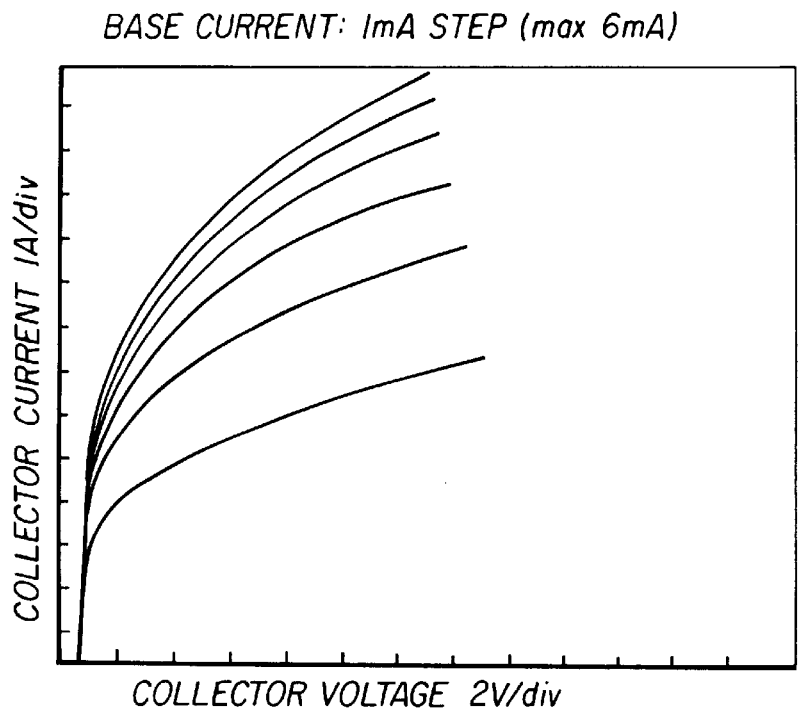
FIG. 21 is a graph showing output characteristics of the MOS power IC of FIG. 19.

Thus, the depletion type IGBT as described above provide a constant-current device having almost the same level of breakdown voltage as the output-stage MOS semiconductor device, and the constant-current device can be easily integrated with the MOS power IC, so that the circuit of FIG. 2 is built or formed in one chip. The resulting MOS power IC has an output characteristic similar to that as shown in FIG. 21, and can be used as an ignition circuit for an ignitor.

Figure 7:
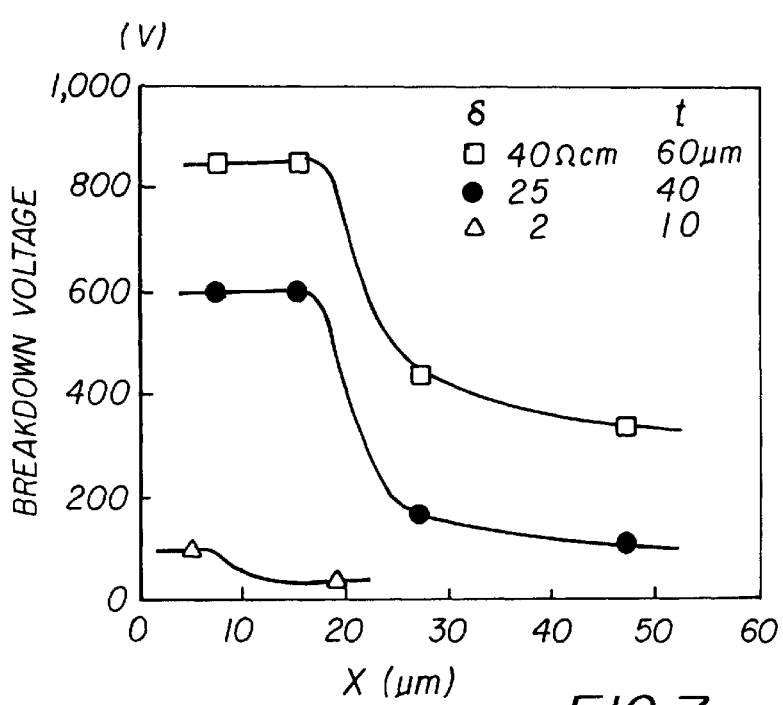
FIG. 7 is a graph showing the relationship between distance "x" and breakdown voltage of depletion type IGBT.

FIG. 7 is a graph showing the relationships between the breakdown voltage of the constant-current device and its dimensions when the resistivity $\delta$ and thickness t of the epitaxial layer that provides the n− drift layer are varied as parameters. In FIG. 7, the horizontal axis indicates the length x the short side of the rectangular exposed region of the n− drift layer that is surrounded by the p− well region, and the vertical axis indicates the breakdown voltage.

When the epitaxial layer has a resistivity of 25 $\Omega$.cm and a thickness of 40 $\mu$m, for example, the constant-current device shows a breakdown voltage of about 600V, which is equivalent to that of the output-stage IGBT, if the length x is equal to or smaller than 15 $\mu$m. If the length x exceeds 15 $\mu$m, however, the breakdown voltage is rapidly reduced, and, if it is 30 $\mu$m or larger, the breakdown voltage is reduced down to about 100V. This is because the depletion layers that spread from the opposite p− well regions are less likely to or fail to be joined together as the length x increases, and so-called pinch-off does not take place. Similar tendencies are observed in the cases where the resistivity is 40 Ω.cm and the thickness is 60 μm, and where the resistivity is 2 Ω.cm and the thickness is 10 μm. It will be therefore understood that the length x should be controlled to be about two-thirds of the thickness of epitaxial layer.

Figure 9:
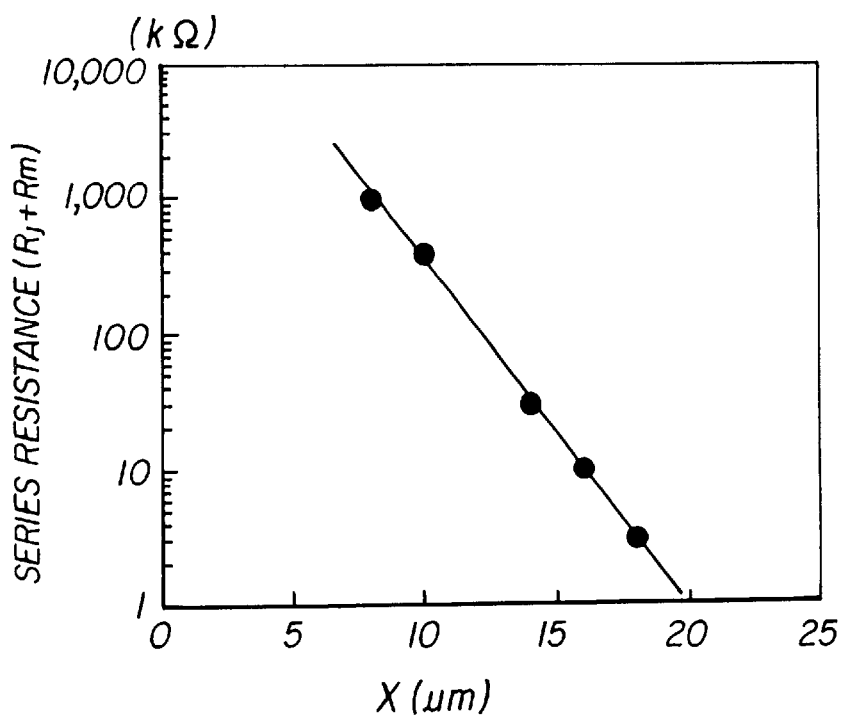
FIG. 9 is a graph showing the relationship between distance "x" and series resistance of depletion type IGBT.

FIG. 9 is a graph showing the relationship between the series resistance (Rj+Rn) as indicated above, and dimension of the constant-current device, where the epitaxial layer has a resistivity of 25 Ω.cm and a thickness is 40 μm. In FIG. 9, the horizontal axis indicates the length x of the short side of the rectangular exposed region of the n⁻ drift layer that is surrounded by the p⁻ well region, and the vertical axis indicates the series resistance.

As the length x increases, the series resistance (Rj+Rn) is rapidly reduced. As shown in FIG. 6, the voltage at which the depletion IGBT enters a constant-current region is increased as the series resistance (Rj+Rn) increases. Suppose the maximum series resistance is 1 MΩ in an actual device, the length x is desirably 8 μm or greater. In other words, the length x is desirably at least one-sixth of the thickness of the epitaxial layer.

Figure 8:
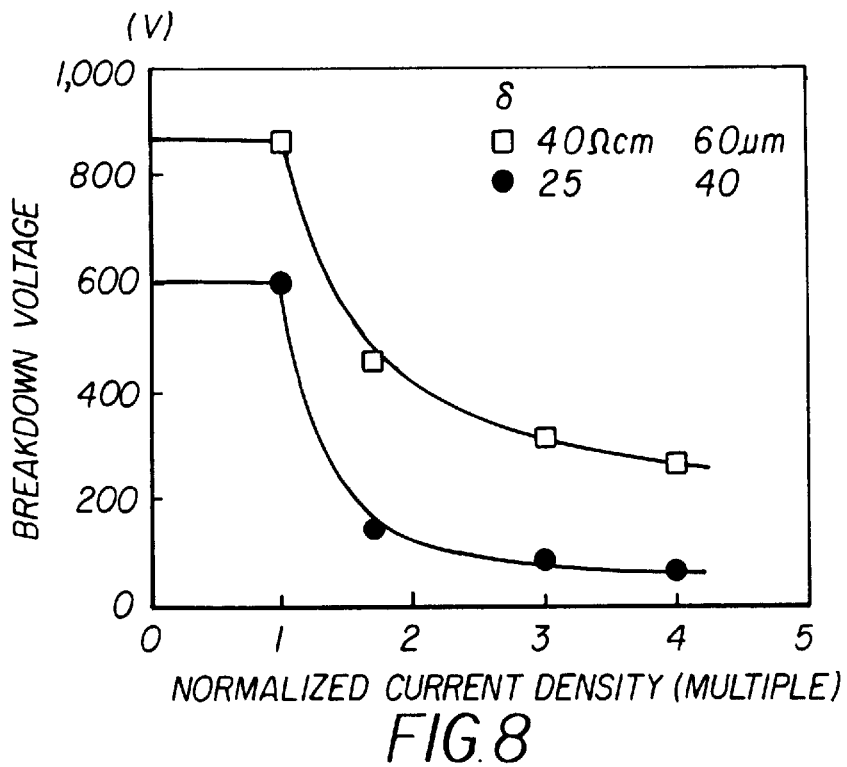
FIG. 8 is a graph showing the relation ship between the current density and breakdown voltage of depletion type IGBT.

FIG. 8 is a graph showing the relationships between the breakdown voltage of the high-voltage constant-current device and the current density, where the resistivity and thickness of the epitaxial layer that provides the n⁻ drift layer are varied as parameters. In FIG. 8, the vertical axis indicates the breakdown voltage, and the horizontal axis indicates the current density of the constant-current device when the current flows below the gate electrode, as standardized with respect to the current density of the output-stage IGBT, which is 85 A/cm².

When the epitaxial layer has a resistivity of 25 Ω.cm and a thickness of 40 μm, for example, the constant-current device shows a breakdown voltage of about 600 V if the current density is equal to or smaller than that of the output-stage IGBT, i.e., 85 A/cm², or smaller. If the current density of the constant-current device becomes larger than 85 A/cm², however, the breakdown voltage rapidly decreases, and, if it is twice or more that of the output-stage IGBT, the breakdown voltage is reduced down to about 100V. This is because a potential difference arises within the n⁻ depletion region and p⁻ well region, resulting in latch-up of a pnpn parasitic thyristor. A similar tendency is observed when the resistivity is 40 Ω.cm, and the thickness is 60 μm. It will be thus understood that the current density of the constant-current device is preferably controlled to be about twice or smaller than that of the output-stage IGBT.

The depletion IGBT that serves as a constant-current device should be designed taking account of the above points.

Figure 10A:
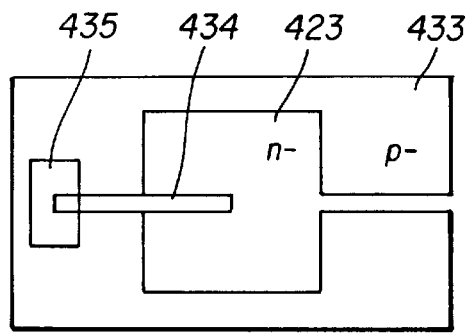
FIGS. 10(a) through 10(d) are plan views of modified examples of depletion IGBTs.
Figure 10B:
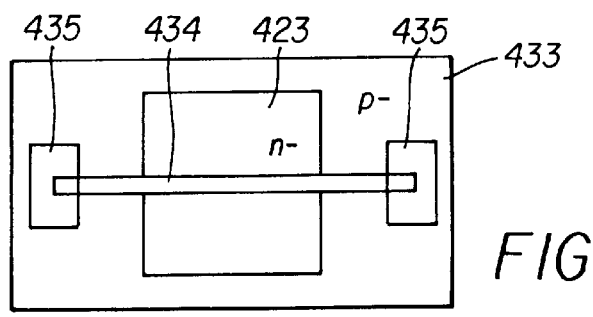
Figure 10C:
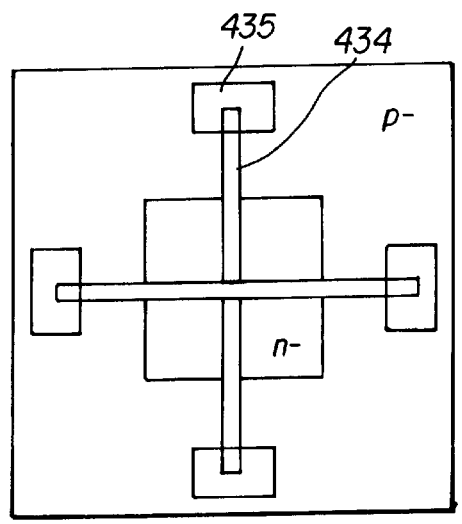
Figure 10D:
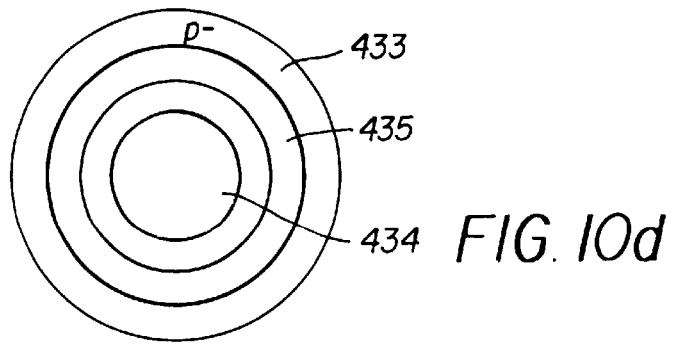

FIG. 10(a) through FIG. 10(d) are plan views of modified examples of constant-current devices. As shown in FIG. 10(a) that illustrates a modification of the device of FIG. 3(a), the p⁻ well region 433 need not entirely or completely surround the exposed portion of the n⁻ drift layer, but may have a narrow gap or clearance that extends outwards from its middle aperture. In the example of FIG. 10(b), two n⁺ emitter regions 435 are formed in the p⁻ well region 433, such that these emitter regions 435 are connected to each other by the n⁻ depletion region 434. In the example of FIG. 10(c), four n⁺ emitter regions 435 are formed in the p⁻ well region 433, such that these emitter regions 435 are connected by a cross-shaped n⁻ depletion region 434. In the example of FIG. 10(d), an annular n⁻ emitter region 435 is formed in a p⁻ well region 433 having a circular shape, and an n⁻ depletion region 434 is formed inside the emitter region 435. Various other modifications may also be employed.

Figure 11:
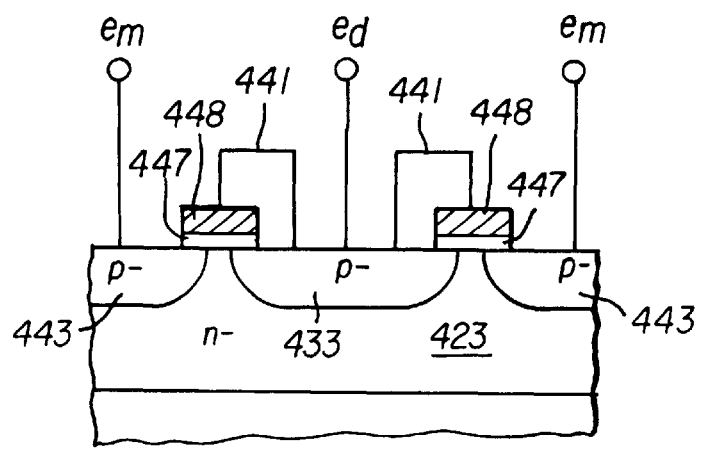
FIG. 11 is a schematic view of a $p^-$ well isolation structure.

FIG. 11 is a schematic cross-sectional view showing the relationship between the depletion IGBT and its surrounding. As shown in FIG. 1, the isolation gate electrode layer 448 is formed on the isolated gate oxide film 447, over the surface of the n⁻ drift layer 423 that is interposed between the p⁻ well region 433 and the p⁻ isolation region 443, and the emitter electrode 441 also contacts with the isolation gate electrode layer 448. If the potential of the emitter electrode 441 is made higher than that of the surrounding p⁻ isolation region 443, therefore, electrons are inducted in a surface layer of the n⁻ drift layer 423 below the isolation gate electrode layer 448, so as to prevent formation of an inversion layer between the p⁻ well region 433 and the surrounding p⁻ isolation region 443, and resulting conduction between these regions 433, 443.

Second Embodiment

Figure 12:
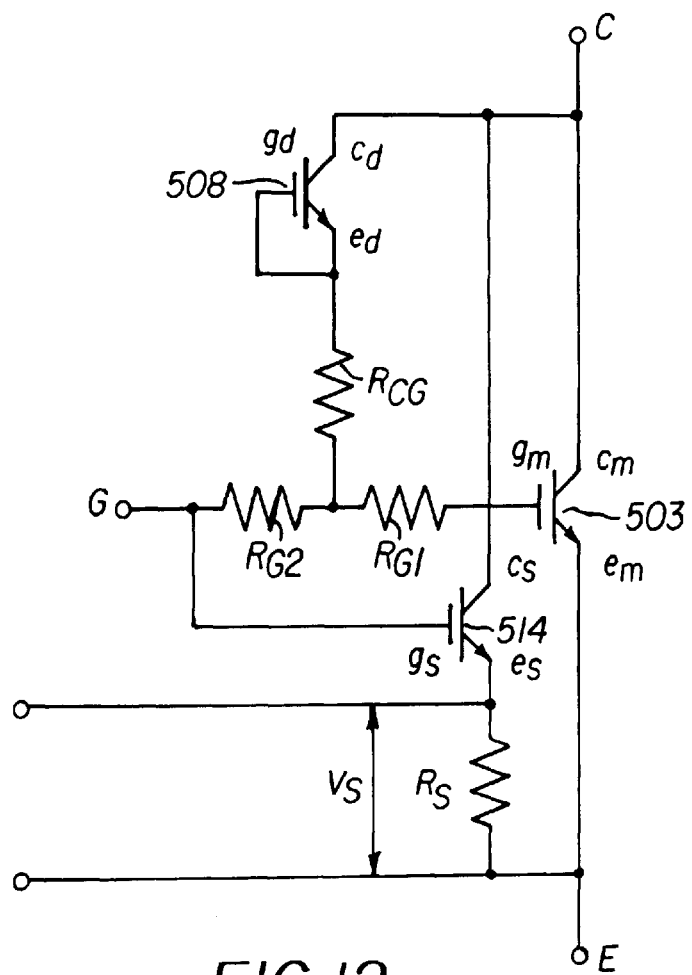
FIG. 12 is a circuit diagram of a MOS power IC according to the second embodiment of the present invention.

FIG. 12 is a circuit diagram showing the configuration of a MOS power IC as a second embodiment of the present invention in which the depletion type MOS semiconductor device as described above is mounted. In this embodiment, the collector ($c_m$) of an output IGBT 503 is connected to the C terminal, and its emitter ($e_m$) is connected to the E terminal. Between the C terminal and the E terminal, a sense IGBT 514 and a sense resistor Rs that are connected in series are provided in parallel with the output IGBT 503, such that the sense collector ($c_s$) of the sense IGBT 514 is connected to the C terminal. Gate resistors ($R_{G1}$, $R_{G2}$) are connected between the main gate ($g_m$) of the output IGBT 503 and the G terminal, and the gate ($g_s$) of the sense IGBT 514 is connected to the G terminal. The MOS power IC thus constructed is able to detect current of the sense IGBT 514, and that of the output-stage IGBT 503, based on a voltage drop Vs across the sense resistor Rs. A depletion IGBT 508 and a resistor ($R_{CG}$) are connected in series, between the C terminal and a middle point of the gate resistors ($R_{G1}$, $R_{G2}$), such that the collector ($c_m$) of the output-stage IGBT 503 and the collector ($c_d$) of the depletion IGBT 508 are both connected to the C terminal. The C terminal is connected to an inductive load that is not illustrated. The resistor ($R_{CG}$) functions to determine the voltage at which the depletion IGBT 508 enters a constant-current region, and its value is as large as several tens of kΩ, for example.

The depletion IGBT 508, which has substantially the same structure as that of the first embodiment, provides a high breakdown voltage, and can be readily mounted in the MOS power IC.

With the MOS power IC constructed as described above, the gate resistors ($R_{G1}$, $R_{G2}$) separate the gate ($g_s$) of the sense IGBT 514 from the main gate ($g_m$) of the output-stage IGBT 503. Further, since the value of the resistor ($R_{CG}$) is as large as several tens of kΩ, the current-voltage characteristic of the depletion IGBT 508 is normally in an unsaturated region in which the current increases with the voltage. As the potential of the C terminal increases, therefore, the current increases proportionally, and the potential of the main gate ($g_m$) of the output-stage IGBT 503 is increased due to the potential difference across the gate resistance ($R_{G2}$). With the potential of the C terminal thus reflected in a feedback manner, the MOS power IC exhibits the current-voltage characteristics as shown in FIG. 21. In this connection, the resistor $R_{CG}$ is selected in accordance with the value of the gate resistor $R_{G2}$. If an even larger resistance is used as the resistance $R_{CG}$, with no limitation to its location, therefore, the gate resistor $R_{G1}$ may be eliminated.

Figure 22:
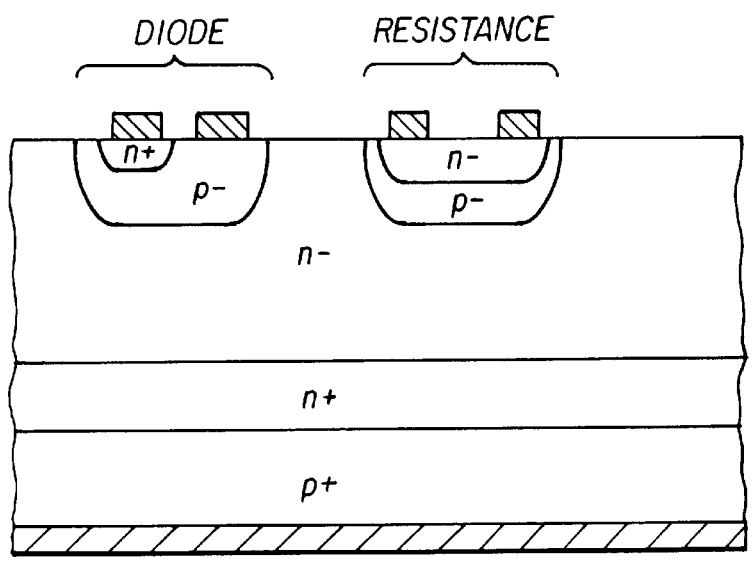
FIG. 22 is a cross-sectional view of a part of a conventional MOS power IC.

Since the series resistance can be varied by changing design dimensions of the depletion IGBT 508, as shown in the graph of FIG. 9, the resistor $R_{CG}$ does not necessarily consist of an exterior resistor. Since the resistor constructed as shown in FIG. 22 results in latch-up of a parasitic thyristor, it is preferable that the resistor is formed from a polysilicon layer that is insulated from the substrate by an insulating film.

Third Embodiment

Figure 13:
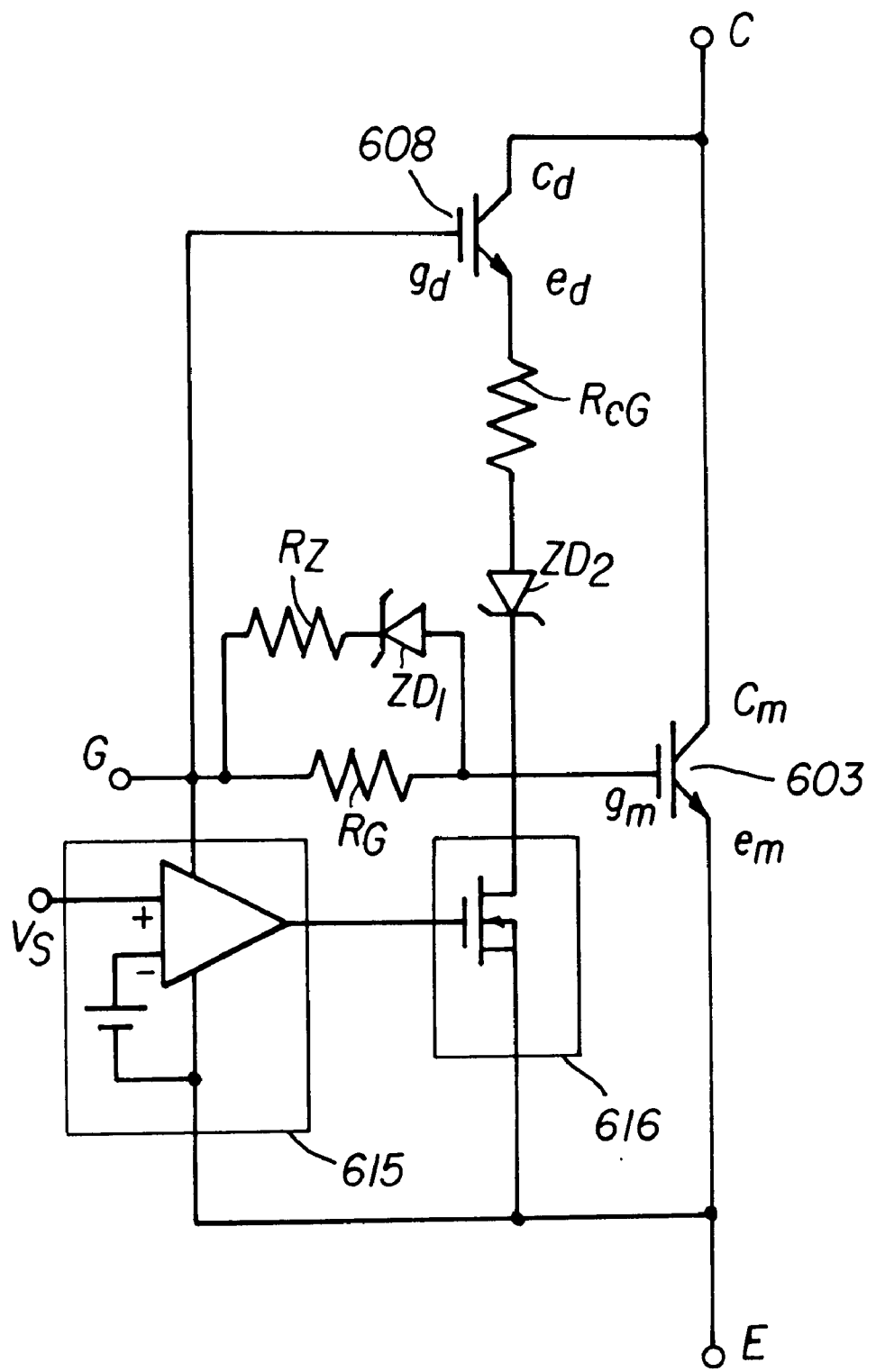
FIG. 13 is a circuit diagram of a MOS power IC according to the third embodiment of the present invention.

FIG. 13 is a circuit diagram showing the configuration of a MOS power IC as a third embodiment of the invention in which a depletion type MOS semiconductor device is mounted. In the present embodiment, the collector ($c_m$) of an output-stage IGBT 608 is connected to the collector ($c_d$) of a depletion type IGBT 608, and a Zener diode ($ZD_2$) is connected to the emitter ($e_d$) of the depletion type IGBT 608 through a resistor $R_{CG}$, such that its anode is located on the side of the C terminal and its cathode is located on the side of the main gate ($g_m$) of the output-stage IGBT 603. The gate ($g_d$) of the depletion type IGBT 608 is connected to the control input terminal G, and a gate resistor ($R_G$), and a branch of series-connected Zener diode ($ZD_1$) and a resistor (Rz) are connected in parallel with each other, between the G terminal and the main gate ($g_m$) of the output-stage IGBT 603. An internal control circuit 615 is connected between the G terminal and the E terminal, and a turn-off circuit 616 is connected between the main gate ($g_m$) of the output-stage IGBT 603 and the E terminal. For instance, the internal control circuit 615 includes an op-amp that serves to generate a signal that corresponds to the voltage drop Vs across the sense resistor Rs of the second embodiment, or the like, and the turn-off circuit 616 includes a MOSFET that serves to control the voltage of the main gate ($g_m$) of the output-stage IGBT 603. The gate resistor ($R_G$) functions to prevent current of a microcomputer level, from flowing from the G terminal, and generally has a value of several kilo-ohms.

The depletion IGBT 608, which has substantially the same structure as that of the first embodiment, provides a high breakdown voltage, and may be readily mounted in the MOS power IC.

With the MOS power IC constructed as described above, the output-stage IGBT 603 is triggered by almost the same potential as that of the C terminal, and therefore the turn-on time can be reduced by about one order of magnitude, as compared with the case where the depletion IGBT 608 is not provided.

The Zener diode ($ZD_2$) connected to the emitter ($e_d$) of the depletion IGBT 608 serves to prevent leakage current when the potential of the G terminal becomes higher than that of the C terminal, and may be eliminated if other means is provided for preventing the leakage current.

The resistor ($R_{CG}$) connected to the emitter ($e_d$) of the depletion IGBT 608 serves to adjust the turn-on speed, and is not necessarily provided.

The Zener diode ($ZD_1$) and the resistance (Rz) connected in series with the diode ($ZD_1$) serve to adjust the turn-off speed, and is not necessarily provided.

Figure 14:
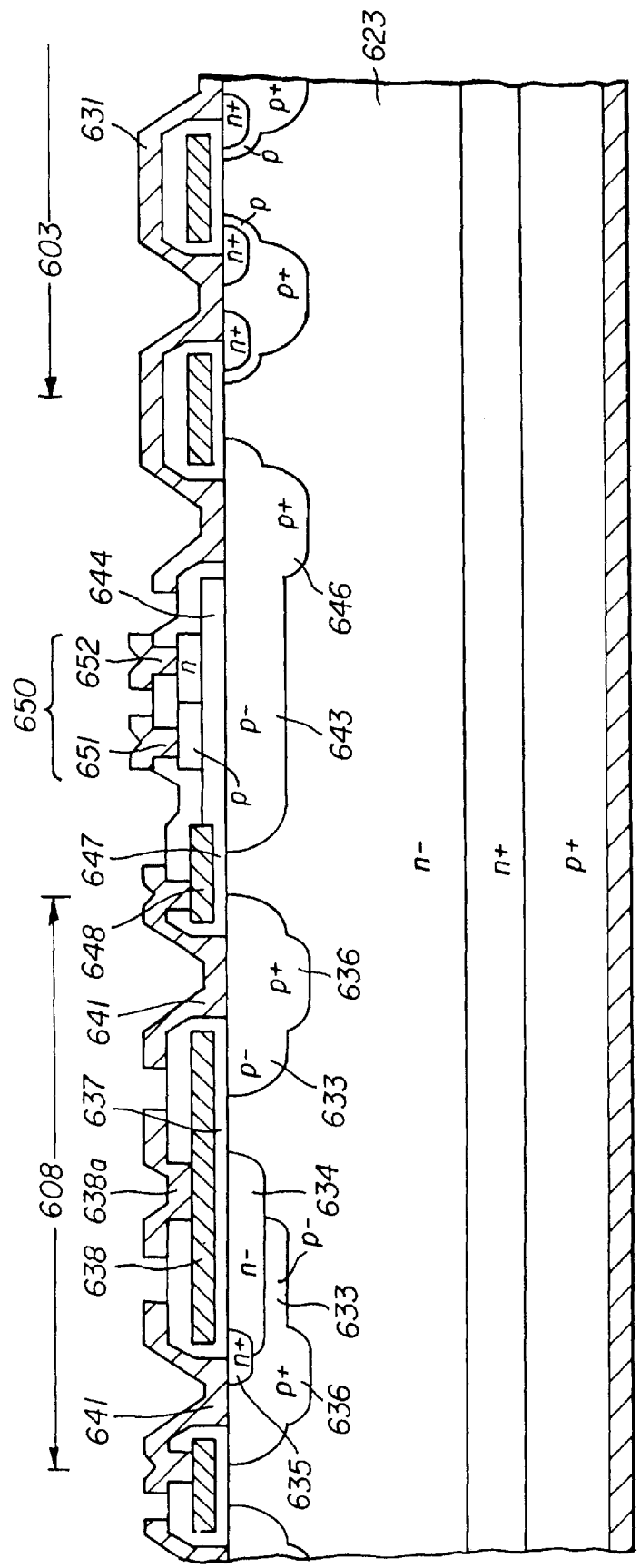
FIG. 14 is a cross-sectional view of a part of the MOS power IC according to the third embodiment of the invention.

FIG. 14 is a cross-sectional view of a part of the MOS power IC of FIG. 12 in which the depletion type MOSFET is integrated with the output-stage IGBT. The output-stage IGBT 603 is illustrated in the right-hand side portion of FIG. 14.

In the left-hand side portion of FIG. 14, the depletion layer IGBT 608 is formed within and on a p⁻ well region 633 formed in a surface layer of an n⁻ drift layer 623. While the emitter ($e_d$) and the gate ($g_d$) are connected to each other and self-excited in the depletion IGBTs of the first and second embodiments, the gate ($g_d$) of the depletion IGBT 608 of the present embodiment is formed independently of the emitter ($e_d$), and connected to the G terminal. Namely, an n⁺ emitter region 635 is formed in a selected area of the surface layer of the p⁻ well region 633, and an n⁻ depletion region 634 is formed in the surface layer of the p⁻ well region 633 to extend from the n⁺ emitter region 635 to an exposed surface portion of the n⁻ drift layer 623, while a gate electrode layer 638 made of polysilicon is formed on a gate oxide film 637, over the surface of the n⁻ depletion region 634, as in the previous embodiments. The present embodiment is different from the previous embodiments in that an emitter electrode 641 that is formed in contact with both of the n⁺ emitter region 635 and the p⁻ well region 633 is not connected to a gate electrode 638a formed in contact with the gate electrode layer 638.

As shown in the middle portion of FIG. 14, a p⁻ isolation region 632 and a p' isolation region 646 are formed in a surface layer of the n⁻ drift layer 623 that is interposed between the depletion IGBT 608 and the output-stage IGBT 603, and the main emitter electrode 631 is formed in contact with the surface of the p⁻ isolation region 643. The p⁻ isolation region 643 is covered with a thick field oxide film 644, and a Zener diode 650 made of polysilicon is formed on the field oxide film 644. The Zener diode 650 is provided with an anode electrode 651 and a cathode electrode 652.

As in the previous embodiments, an isolation gate electrode layer 648 is formed on an isolation gate oxide film 647, over the surface of the n⁻ drift layer 623 that is interposed between the p⁻ well region 633 and the p⁻ isolation region 643, and the emitter electrode 641 is also in contact with the isolation gate electrode layer 648.

With the above arrangement in which the Zener diode ($ZD_2$) of FIG. 13 consists of a polysilicon layer deposited on the field oxide film 644 as shown in FIG. 14, a parasitic thyristor is prevented from latching up as in the case where the Zener diode is mounted or formed directly on the silicon substrate as shown in FIG. 22, and the resulting semiconductor apparatus operates with improved reliability.

Where the resistor ($R_{CG}$) of FIG. 13 also consists of a polysilicon layer that is deposited on the field oxide film 644 as shown in FIG. 14, a parasitic thyristor is prevented from latching up as in the case where the resistor is mounted or formed directly on the silicon substrate, and the resulting semiconductor apparatus operates with improved reliability.

Where the Zener diode ($ZD_1$) and resistors ($R_G$, Rz) of FIG. 13 also consist of polysilicon layers deposited on the field oxide film 644 as shown in FIG. 14, the possibility of latch-up of parasitic thyristor can be similarly eliminated.

Fourth Embodiment

Figure 15:
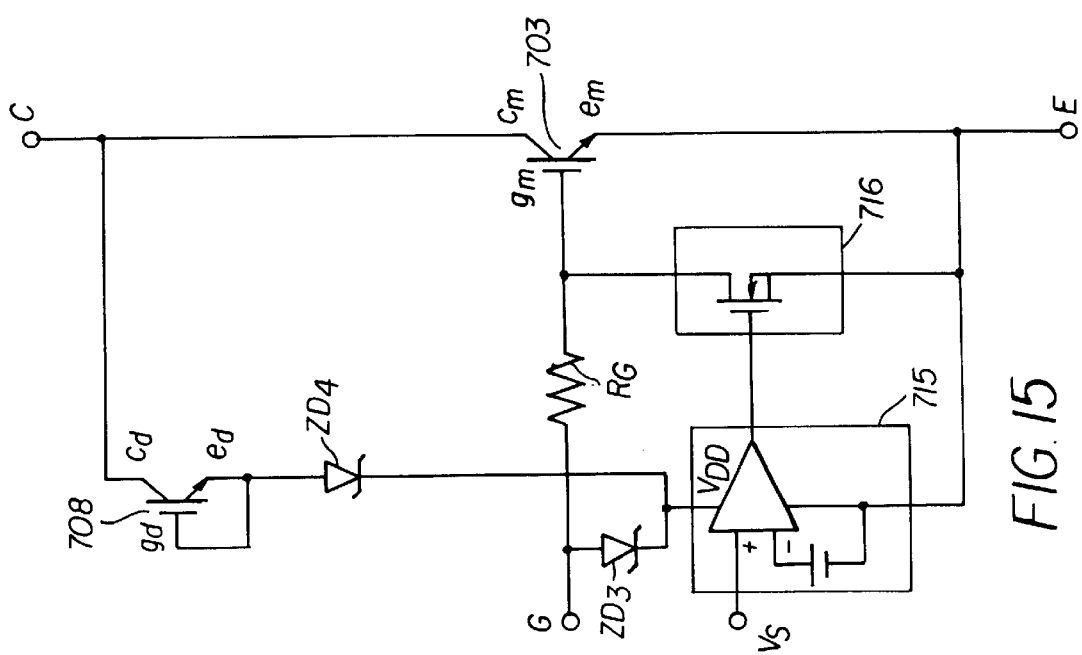
FIG. 15 is a circuit diagram of a MOS power IC according to the fourth embodiment of the present invention.

FIG. 15 is a circuit diagram showing the construction of a MOS power IC as a fourth embodiment of the present invention in which the depletion type MOS semiconductor device according to the present invention is mounted. In this embodiment, the collector ($c_m$) of the output-stage IGBT 703 is connected to the collector ($c_d$) of a depletion type IGBT 708, and a Zener diode ($ZD_4$) is connected to the emitter ($e_d$) of the depletion type IGBT 708, such that its anode is located on the side of the C terminal, and its cathode is located on the side of a power supply terminal $V_{DD}$ of an internal control circuit 715. The gate ($g_d$) of the depletion IGBT 708 is shorted to the emitter ($e_d$) thereof, to provide a self-excitation type device. A gate resistor $R_G$ is connected between the control input terminal G and the main gate ($g_m$) of the output-stage IGBT 703, and a turn-off circuit 716 is connected between the main gate ($g_m$) of the output-stage IGBT 703 and the E terminal. A Zener diode ($ZD_3$) is connected between the G terminal and the power supply terminal ($V_{DD}$) of the internal control circuit 715, such that its anode is located on the side of the G terminal, and its cathode is located on the side of the power supply terminal $V_{DD}$. For instance, the internal control circuit 715 includes an op-amp that serves to generate a signal that corresponds to the voltage drop Vs across the sense resistance Rs of the second embodiment, or the like, and the turn-off circuit 716 includes a MOSFET that serves to control the voltage of the main gate ($g_m$) of the output-stage IGBT 703.

The depletion IGBT 708, which has substantially the same structure as that of the first embodiment, provides a high breakdown voltage, and may be readily integrated with the output-stage IGBT 703 in the MOS power IC.

With the MOS power IC constructed as described above, the internal control circuit 716 does not require a separate power supply since electric power is constantly supplied from the C terminal to the internal control circuit 716, which leads to a simplified configuration of the circuit, and reduced loss. As another advantage, the internal control circuit 715 can be driven even where the G terminal has a relatively low potential.

The Zener diode ($ZD_4$) connected to the emitter ($e_d$) of the depletion IGBT 708 serves to prevent leakage current when the potential of the G terminal becomes higher than that of the C terminal, and may be eliminated if other means is provided for preventing the leakage current.

Where the Zener diode ($ZD_4$) of FIG. 15 is formed by depositing a polysilicon layer on a field oxide film as in the embodiment of FIG. 14, it is possible to avoid latch-up of a parasitic thyristor that would otherwise occur when the Zener diode is mounted directly on the silicon substrate as shown in FIG. 22, thus assuring improved operation reliability of the semiconductor apparatus.

The Zener diode ($ZD_3$) connected between the G terminal and the power supply terminal ($V_{DD}$) of the internal control circuit 715 serves to prevent flow of parasitic current that would otherwise occur when the potential of the C terminal becomes higher than that of the G terminal. The Zener diode ($ZD_3$) may be eliminated if other means is provided for preventing parasitic current.

Where the Zener diode ($ZD_3$) is formed by depositing a polysilicon layer on a field oxide film, it is possible to prevent latch-up of a parasitic thyristor that would otherwise occur when the Zener diode or resistor is mounted directly on the silicon substrate as shown in FIG. 22, thus assuring an improved operating reliability of the semiconductor apparatus.

Fifth Embodiment

Figure 16:
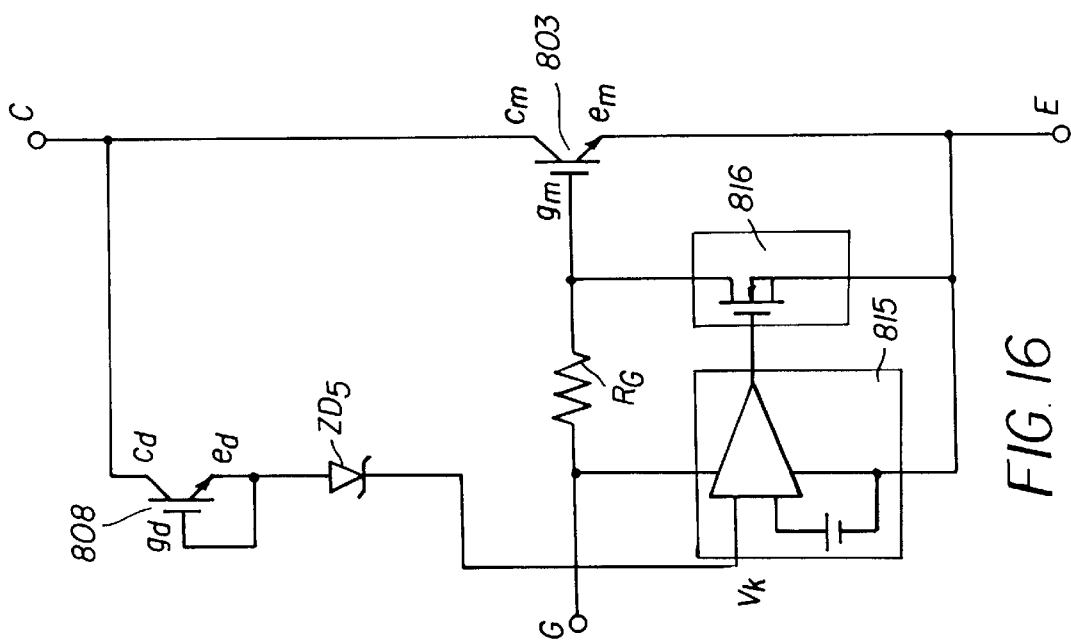
FIG. 16 is a circuit diagram of a MOS power IC according to the fifth embodiment of the present invention.

FIG. 16 is a circuit diagram showing the construction of a MOS power IC as a fifth embodiment of the present invention in which the depletion type MOS semiconductor device according to the present invention is mounted. In this embodiment, the collector ($c_m$) of an output-stage IGBT 803 is connected to the collector ($c_d$) of the depletion type IGBT 808, and a Zener diode ($ZD_5$) is connected to the emitter ($e_d$) of the depletion type IGBT 808, such that its anode is located on the side of the C terminal, and its cathode is located on the side of a substrate voltage detecting terminal ($V_k$) of an internal control circuit 815. The internal control circuit 815 is connected between the G terminal and the E terminal, and a turn-off circuit 816 is connected between the main gate ($g_m$) of the output-stage IGBT 803 and the E terminal. The gate ($g_d$) of the depletion IGBT 808 is shorted to the emitter ($e_d$) thereof, to provide a self-excitation type device. A gate resistor $R_G$ is connected between the G terminal and the main gate ($g_m$) of the output-stage IGBT 803. In this embodiment, the internal control circuit 815 may include a comparator having a reference voltage, as shown in FIG. 16.

The depletion IGBT 808, which has substantially the same structure as that of the first embodiment, provides a high breakdown voltage, and may be readily integrated with the output-stage IGBT 803 in the MOS power IC.

With the MOS power IC constructed as described above, the internal control circuit 815 serves to compare the substrate potential with the reference voltage, thereby to detect the potential of the substrate. As a conventional method of detecting the substrate potential, the potential of the C terminal is supplied to a detecting circuit through a branch having two resistors, or a branch having a resistor and a Zener diode. In such a method, however, current is caused to constantly flow through the resistor(s). In the case where the resistor is mounted on the semiconductor substrate, in particular, the upper limit of its resistance is about several hundreds of kΩ, and, if the voltage of the C terminal is equal to 1000V, for example, several mA of current is kept flowing through the resistor, resulting in a substantial loss. In the circuit of the present embodiment, on the other hand, there is no need to provide the resistor(s) and/or diode, and the loss can be thus reduced.

The Zener diode ($ZD_5$) connected to the emitter ($e_d$) of the depletion IGBT 808 serves to prevent flow of parasitic current that would otherwise occur when the potential of the G terminal becomes higher than that of the C terminal. This diode ($ZD_5$) may be omitted where other means is provided for preventing the parasitic current.

Where the Zener diode ($ZD_5$) of FIG. 16 is formed by depositing a polysilicon layer on a field oxide film as in the embodiment of FIG. 14, it is possible to prevent latch-up of a parasitic thyristor that would otherwise occur when the Zener diode is formed directly on the silicon substrate, thus assuring an improved operating reliability of the semiconductor apparatus.

Sixth Embodiment

While both of the output-stage MOS semiconductor device and depletion type MOS semiconductor device consist of IGBTs in the illustrated embodiments, the principle of the present invention is not limited to the MOS semiconductor devices in the form of IGBTs. The present invention may also applied to MOS semiconductor devices, such as MOSFET or MOS thyristor having a gate of MOS structure.

Figure 17:
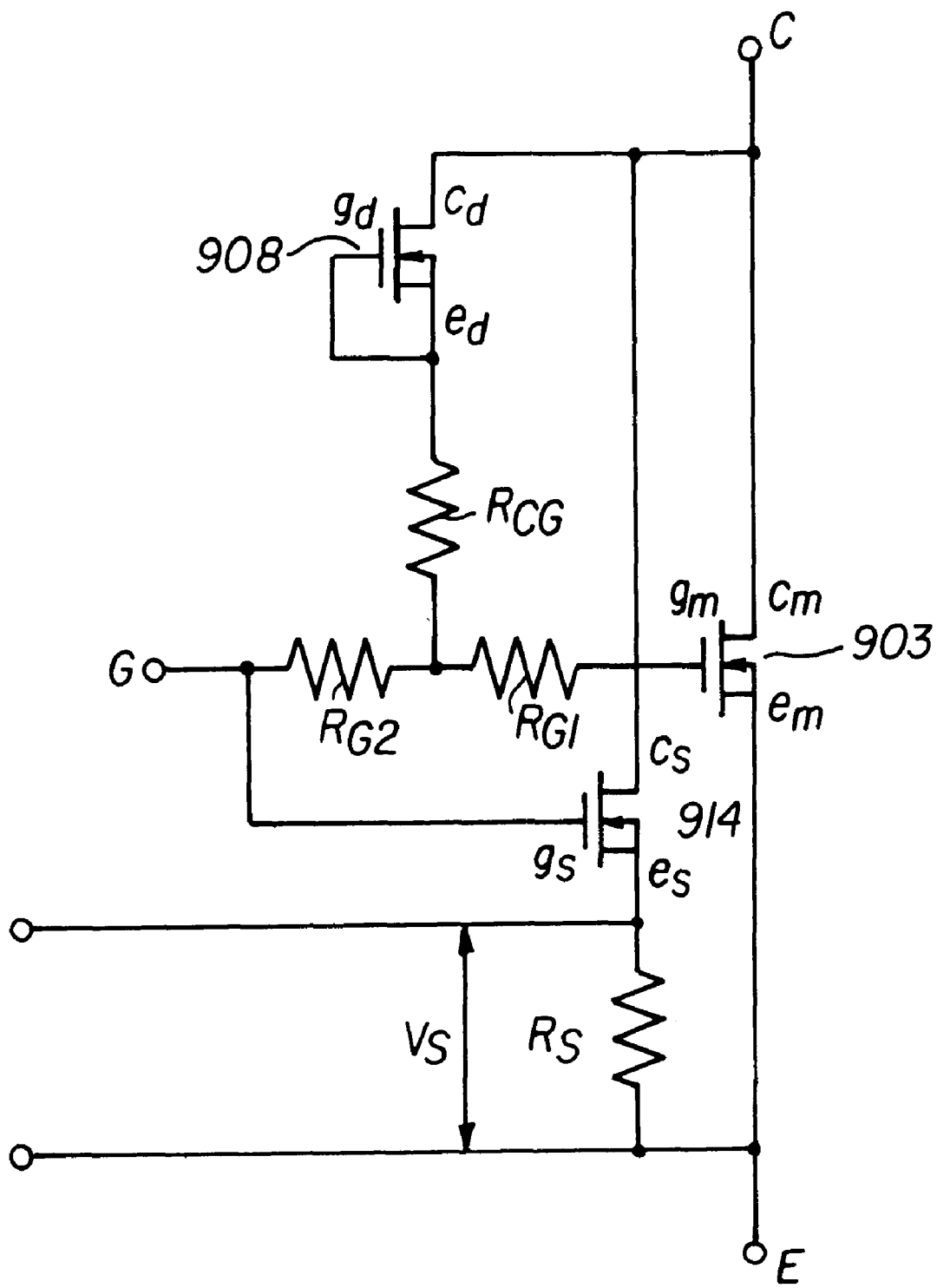
FIG. 17 is a circuit diagram of a MOS power IC according to the sixth embodiment of the present invention.

FIG. 17 is a circuit diagram showing the construction of a MOS power IC as a sixth embodiment of the invention in which a depletion type MOSFET as another type of depletion type MOS semiconductor device is integrated with an output-stage semiconductor device that also consists of a MOSFET. To make it easy to compare the output-stage and depletion type MOSFETs with the IGBTs of the previous embodiments, the drain and source of the MOSFET will be called "collector" and "emitter", respectively. The collector ($c_m$) of the output-stage MOSFET 903 is connected to the C terminal, and the emitter ($e_m$) is connected to the E terminal. Between the C terminal and the E terminal, series-connected sense MOSFET 914 and sense resistor (Rs) are connected in parallel with the output-stage MOSFET 903, such that the sense collector ($c_s$) of the sense MOSFET 914 is connected to the C terminal. Also, gate resistors ($R_{G1}$, $R_{G2}$) are connected between the main gate ($g_m$) of the output-stage MOSFET 903 and the G terminal, and the gate ($g_s$) of the sense MOSFET 914 is connected to the G terminal. The MOS power IC is able to detect current through the sense MOSFET 914, and also detect current through the output-stage MOSFET 903, based on the voltage drop Vs across the sense resistance Rs. The depletion type MOSFET 908 and a resistor ($R_{CG}$) are connected in series, between the C terminal to which the collector ($c_m$) of the output-stage MOSFET 903 and the collector ($c_d$) of the depletion MOSFET 908 are both connected, and a middle point of the gate resistors ($R_{G1}$, $R_{G2}$). The C terminal is connected to an inductive load that is not illustrated. The resistor ($R_{CG}$) functions to determine the voltage at which the depletion IGBT 908 enters a constant-current region, and its value is as large as several tens of kΩ, for example.

With the MOS power IC constructed as described above, the gate resistors ($R_{G1}$, $R_{G2}$) separate the gate ($g_s$) of the sense MOSFET 914 from the main gate ($g_m$) of the output-stage MOSFET 903. Further, since the resistor ($R_{CG}$) is as large as several tens of kΩ, the current-voltage characteristic of the depletion MOSFET 908 is normally in an unsaturated region in which the current increases with the voltage. As the potential of the C terminal increases, therefore, the current through the MOSFET 908 increases proportionally, and the potential of the main gate ($g_m$) of the output-stage MOSFET 903 is increased due to the potential difference across the gate resistance ($R_{G2}$). With the potential of the C terminal reflected in a feedback manner, the depletion type MOSFET 908 exhibits a current-voltage characteristic similar to that as shown in FIG. 21. In this connection, the resistor $R_{CG}$ is selected depending upon the value of the gate resistor $R_{G2}$. If an even larger resistance can be used as the resistance $R_{CG}$, with no limitation to its location, therefore, the gate resistor $R_{G1}$ may be eliminated.

Since the series resistance can be varied by changing design dimensions of the depletion MOSFET 908, as shown in the graph of FIG. 9, the resistor $R_{CG}$ does not necessarily consist of an exterior resistor. Since the resistor constructed as shown in FIG. 22 may result in latch-up of a parasitic thyristor, it is preferable that the resistor is formed from a polysilicon layer that is insulated from the substrate by an insulating film.

Figure 18:
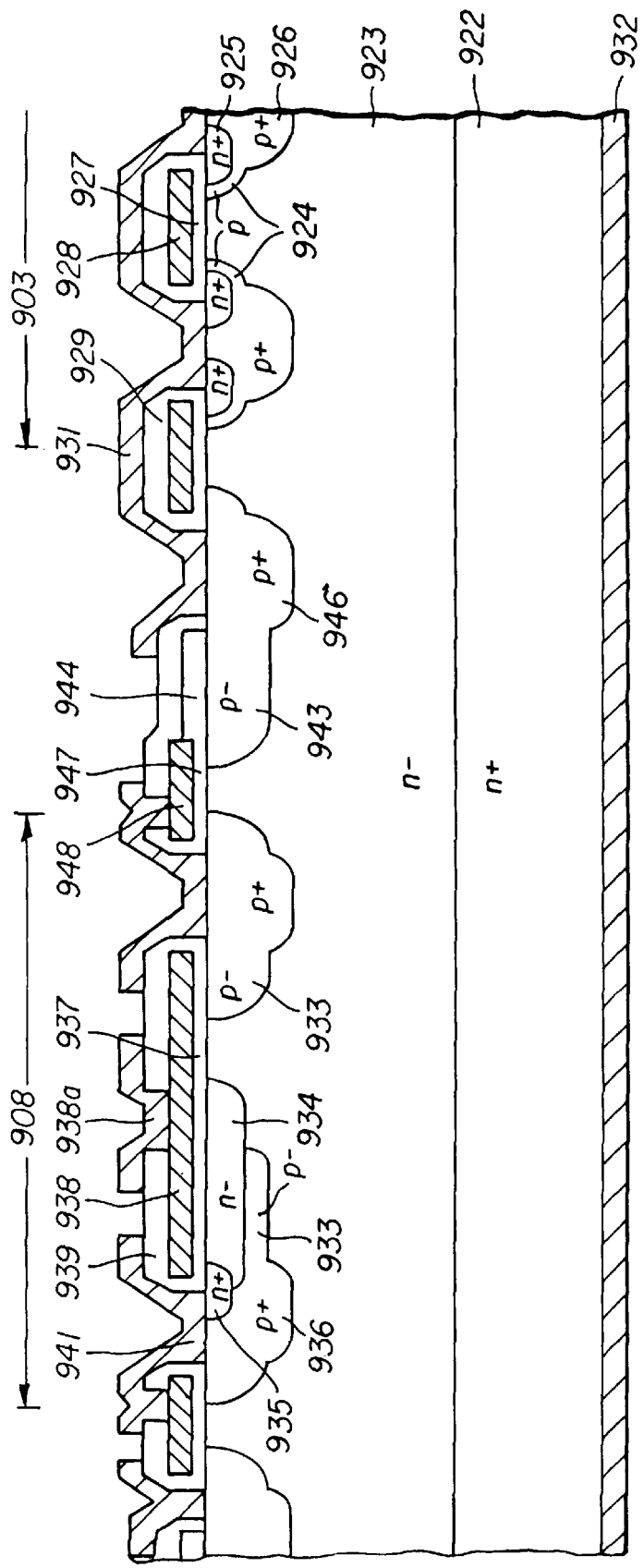
FIG. 18 is a cross-sectional view of a part of the MOS power IC according to the sixth embodiment of the invention.

FIG. 18 is a cross-sectional view of a part of the MOS power IC of FIG. 17 in which the depletion type MOSFET is integrated with the output-stage MOSFET. The right-hand side portion of FIG. 18 illustrates the output-stage MOSFET 903 that performs switching operations to conduct or cut off the main current. Unlike the MOS power IC of FIG. 14, an n$^+$ buffer layer 922 is formed under an n drift layer 923, and a collector electrode 932 is formed on the lower surface of the n$^+$ buffer layer 922. In the output-stage MOSFET 903, p base regions 924 and p$^+$ main well regions 926 formed as part of the base regions 924 and having a large diffusion depth are formed in selected portions of a surface layer of the n$^-$ drift layer 923. Also, n$^+$ main emitter regions 925 are formed in selected portions of surface layers of the p base regions 424. A gate electrode layer 928 made of polysilicon is formed on a gate oxide film 927, over surfaces of the p base regions 924 interposed between the n$^-$ drift layer 923 and the n$^+$ main emitter regions 925. Further, a main emitter electrode 931 is formed in contact with the surfaces of both of the n$^+$ main emitter regions 925 and p base regions 924, and is connected to the E terminal. Although not illustrated in FIG. 18, a main gate electrode is formed in contact with the main gate electrode layer 928.

As shown in the left-hand side portion of FIG. 18, a p$^-$ well region 933 is formed in the surface layer of the n$^-$ drift layer 923, and the depletion MOSFET 908 is formed on and within the p$^-$ well region 933. The gate ($g_d$) of the depletion MOSFET 908 is formed independently, and connected to the G terminal. To provide the depletion type MOSFET 908, an n$^+$ emitter region 935 is formed in a selected area of the surface layer of the p$^-$ well region 933, and an n$^-$ depletion region 934 is formed in the surface layer of the p$^-$ well region 933 to extend from the n$^+$ emitter region 935 to the exposed portion of the n$^-$ drift layer 923, while a gate electrode layer 938 formed of polysilicon is formed on a gate oxide film 937, over the surface of the n$^-$ depletion region 934. Also, an emitter electrode 941 is formed in contact with surfaces of both of the n$^+$ emitter region 935 and the p$^-$ well region 933, and a gate electrode 928a is formed in contact with the gate electrode layer 938. Although the emitter electrode 941 and the gate electrode 938a are separated from each other in FIG. 18, these electrodes may be shorted to each other where the circuit of FIG. 17 is built in the MOS power IC. The p$^-$ well region 933 serves to reduce base resistance, and may be formed at the same time that the p$^+$ main well regions 926 of the output-stage IGBT 903 are formed.

As shown in the middle part of FIG. 18, a p$^-$ isolation region 943 and a p$^+$ isolation well region 946 formed as part of the isolation region 943 and having a large diffusion depth are formed in a surface layer of the n$^-$ drift layer 923 that is interposed between the depletion MOSFET 908 and the output-stage MOSFET 903. The p$^-$ isolation region 943 is covered with a thick field oxide film 944, and the main emitter electrode 931 is held in contact with a part of the surface of the field oxide film 944.

An isolation gate electrode layer 948 is formed on an isolated gate oxide film 947, over the surface of the n$^-$ drift layer 923 interposed between the p$^-$ well region 933 and the p$^-$ isolation region 943. The main emitter electrode 931 is also held in contact with the isolated gate electrode layer 948. When a voltage that is higher on the side of the collector electrode 932 is applied between the collector electrode 932 and the emitter electrode 941, current flows from to the emitter electrode 941, through the n$^+$ buffer layer 922, n$^-$ drift layer 923, n$^-$ depletion region 934, and the n$^+$ emitter region 935. The series resistance in the current path is the sum of a resistance (Rj) similar to a junction type FET, which appears in a portion of the n$^-$ drift layer 923 that is interposed between the opposite p$^-$ well regions 933, and a resistance (Rn) of the n$^-$ depletion region 934. The voltage at which the depletion MOSFET 908 starts operating in a constant-current region may be controlled by the series resistance and an additional external resistance. If a negative voltage is applied to the gate electrode 938a, the n$^-$ depletion region 934 located right under the gate electrode layer 938 is depleted, and the current can be stopped. If a voltage that is lower on the side of the collector electrode 932 is applied between the emitter electrode 941 and the collector electrode 932, depletion layers that spread from the opposite p$^-$ well region 933 are joined together, thus enabling the device to withstand a considerably high voltage.

The depletion MOSFET 908 has a similar structure to the depletion IGBTs of the previous embodiments, and therefore provides a high breakdown voltage. Thus, the constant-current device having substantially the same breakdown voltage as the output-stage MOS semiconductor device can be easily mounted in the MOS power IC, so that the circuit of FIG. 17 is built in one chip.

The resistor ($R_{CG}$), gate resistors ($R_{G1}$, $R_{G2}$), and the sense resistor (Rs) as shown in FIG. 17 may be formed from polysilicon layers deposited on the field oxide film 944 of FIG. 18. This arrangement prevents latch-up of a parasitic thyristor that would otherwise occur when those resistors are formed directly on the silicon substrate, thus assuring an improved operating reliability of the semiconductor apparatus.

The principle of the present invention may also applied to MOS power ICs having other types of MOS semiconductor devices.

According to the present invention as explained above, the depletion type MOS semiconductor device includes a p⁻ well region formed in a surface layer of an n⁻ drift layer, an n⁺ emitter region formed in a surface layer of the p⁻ well region, an n⁻ depletion region formed in the surface layer of the p⁻ well region, to extend from the n⁺ emitter region to a surface layer of the n⁻ drift layer, a gate electrode layer formed on a gate insulating film, over the n⁻ depletion region, an emitter electrode formed in contact with surfaces of both of the n⁺ emitter region and the p⁻ well region, and a collector electrode formed on a rear surface of the n⁻ drift layer. The thus constructed depletion type MOS semiconductor device may be suitably integrated with a vertical MOSFET or a vertical IGBT in which the collector electrode contacts with a p⁺ collector layer, to easily provide a constant-current device whose breakdown voltage is increased to substantially the same level as the MOSFET or IGBT.

It is particularly important that the p⁻ well region is formed at a substantially middle portion thereof with an aperture, so as to surround the n⁻ depletion region, and the shape or dimensions of the n⁻ depletion region and the thickness of the n⁻ drift layer are suitably determined so as to provide a high breakdown voltage.

Also, the present invention provides a MOS power IC in which the depletion type MOS semiconductor device as described above is mounted, which power IC comprises: an output-stage MOS semiconductor device including a control portion of a metal-oxide-semiconductor (MOS) structure that provides a main gate ($g_m$) as a control input port, a collector ($c_m$) as an output port, and a main emitter ($e_m$); first and second output terminals (C, E) connected to the collector ($c_m$) and the main emitter ($e_m$) of the output-stage semiconductor device; a control input terminal (G) connected to the main gate ($g_m$) of the output-stage semiconductor device; a depletion type MOS semiconductor device that is connected in series with a collector resistance ($R_{CG}$), a branch including the depletion type MOS semiconductor device and the collector resistance ($R_{CG}$) being provided between the first output terminal (C) and the control input terminal (G), such that a collector ($c_d$) of the depletion type MOS semiconductor device is connected to the C terminal. Thus, it is possible to realize a circuit in which the gate ($g_m$) of the output-stage MOS semiconductor device reflects an increase in the potential of the C terminal in a feedback manner. In other examples, circuits suitable for high-speed turn-on and turn-off operations, and circuits for supplying power to internal control circuits may also be realized.

Thus, the present invention greatly contributes to realization of various types of MOS power IC having a high breakdown voltage, wherein MOSFET or IGBT and a constant-current device having an equivalent breakdown voltage are integrated with each other.

What is claimed is:

1. An apparatus comprising:
   a depletion type MOS semiconductor device including:
   an n⁻ drift layer;
   a p⁻ well region formed in a surface layer of the n⁻ drift layer;
   an n⁺ emitter region formed in a surface layer of the p⁻ well region;
   an n⁻ depletion region formed in the surface layer of the p⁻ well region, to extend from the n⁺ emitter region to a surface layer of the n⁻ drift layer;
   a gate electrode layer formed on a gate insulating film, over the n⁻ depletion region;
   an emitter electrode formed in contact with surfaces of both of the n⁺ emitter region and the p⁻ well region; and
   a collector electrode formed on a rear surface of the n⁻ drift layer.

2. An apparatus according to claim 1, further comprising a p⁺ collector layer formed on a rear surface of said n⁻ drift layer, said collector electrode being in contact with the p⁺ collector layer.

3. An apparatus according to claim 1 or claim 2, wherein said p⁻ well region is formed at a substantially middle portion thereof with an aperture, so as to surround said n⁻ depletion region.

4. An apparatus according to claim 2, wherein a plurality of n⁻ depletion regions are formed in the n⁻ drift layer surrounded by one p⁻ well region.

5. An apparatus according to claim 1 or claim 2, wherein said emitter electrode and a gate electrode are connected to each other.

6. An apparatus according to claim 2, wherein said p⁻ well region is formed at a substantially middle portion thereof with an aperture, so as to surround said n⁻ depletion region, and wherein said n⁻ drift layer assumes a substantially rectangular shape, and a length x of a short side of the rectangular shape is not greater than two-thirds of a thickness of the n⁻ drift layer.

7. An apparatus according to claim 2, wherein said p⁻ well region is formed at a substantially middle portion thereof with an aperture, so as to surround said n⁻ depletion region, and wherein said n⁻ drift layer assumes a substantially rectangular shape, and a length x of a short side of the rectangular shape is not smaller than one-sixth of the thickness of the n⁻ drift layer.

8. An apparatus according to claim 1, wherein a plurality of said depletion type MOS semiconductor devices are connected in parallel with each other.

9. An apparatus according to claim 8, wherein the p⁻ well regions of the depletion type MOS semiconductor devices that are connected in parallel with each other are connected to each other.

10. An apparatus according to claim 1, further comprising a p⁻ isolation well region that is formed adjacent to said p⁻ well region, in the surface layer of said n⁻ drift layer, such that a potential of the p⁻ well region is independent of that of the p⁻ isolation well region.

11. An apparatus according to claim 1, further comprising a p⁻ isolation well region that is formed adjacent to said p⁻ well region, in the surface layer of said n⁻ drift layer, and an isolation gate electrode layer formed on an insulating film, over a surface of the n⁻ drift layer that is interposed between the p⁻ well region and the p⁻ isolation well region.

12. An apparatus according to claim 11, wherein said isolation gate electrode layer has a potential that is close to that of said emitter electrode.

13. An apparatus according to claim 11, wherein said emitter electrode is in contact with said isolation gate electrode layer.

14. An apparatus according to claim 1, further comprising:
   an output-stage MOS semiconductor device including a control portion of a metal-oxide-semiconductor (MOS) structure that provides a main gate ($g_m$) as a control input port, a collector ($c_m$) as an output port, and a main emitter ($e_m$);
   first and second output terminals (C, E) connected to the collector ($c_m$) and the main emitter ($e_m$) of said output-stage semiconductor device, respectively; and
   a control input terminal (G) connected to the main gate ($g_m$) of said output-stage semiconductor device;
   wherein said depletion type MOS semiconductor device (408) is connected in series with a collector resistance (Rc) (409), a branch including said depletion type MOS semiconductor device and said collector resistance (Rc) (409) being provided between said first output terminal (C) and said control input terminal (G), such that a collector ($c_d$) of the depletion type MOS semiconductor device is connected to said first output terminal (C).

15. An apparatus as claimed in claim 1, further comprising:
   an output-stage MOS semiconductor device including a control portion of a metal-oxide-semiconductor (MOS) structure that provides a main gate ($g_m$) as a control input port, a collector ($c_m$) as an output port, and a main emitter ($e_m$);
   first and second output terminals (C, E) connected to the collector ($c_m$) and the main emitter ($e_m$) of said output-stage semiconductor device, respectively;
   a control input terminal (G) connected to the main gate ($g_m$) of said output-stage semiconductor device; and
   a gate resistance ($R_{G2}$) connected between the main gate ($g_m$) of said output-stage MOS semiconductor device and said control input terminal (G);
   wherein said depletion type MOS semiconductor device is provided between said first output terminal (C) and said gate resistance ($R_{G2}$), such that the collector electrode ($c_d$) of the depletion type MOS semiconductor device is coupled to said first output terminal (C).

16. An apparatus according to claim 1, further comprising:
   an output-stage MOS semiconductor device including a control portion of a metal-oxide-semiconductor (MOS) structure that provides a main gate ($g_m$) as a control input port, a collector ($c_m$) as an output port, and a main emitter ($e_m$);
   first and second output terminals (C, E) connected to the collector ($c_m$) and the main emitter ($e_m$) of said output-stage semiconductor device, respectively;
   a control input terminal (G) connected to the main gate ($g_m$) of said output-stage semiconductor device; and
   a gate resistance ($R_{G2}$) connected between the main gate ($g_m$) of said output-stage MOS semiconductor device and said control input terminal (G);
   wherein said depletion type MOS semiconductor device (508) is connected in series with a collector resistance ($R_{CG}$), a branch including said depletion type MOS semiconductor device and said collector resistance ($R_{CG}$) being provided between said first output terminal (C) and said gate resistance ($R_{G2}$), such that the collector electrode ($c_d$) of the depletion type MOS semiconductor device is coupled to said first output terminal (C).

17. An apparatus according to claim 15 or 16, further comprising a sense MOS semiconductor device (514) and a resistance (Rs) that are connected in series, a branch including the sense MOS semiconductor device and the resistance (Rs) being provided between said first and second output terminals (C, E), such that a sense collector ($c_s$) of the sense MOS semiconductor device is connected to said first output terminal (C), and a sense gate ($g_s$) of the sense MOS semiconductor device is connected to said control input terminal (G).

18. An apparatus as claimed in claim 1, further comprising:
   an output-stage MOS semiconductor device (603) including a control portion of a metal-oxide-semiconductor (MOS) structure that provides a main gate ($g_m$) as a control input port, a collector ($c_m$) as an output port, and a main emitter ($e_m$);
   first and second output terminals (C, E) connected to the collector ($c_m$) and the main emitter ($e_m$) of said output-stage semiconductor device, respectively;
   a control input terminal (G) connected to the main gate ($g_m$) of said output-stage semiconductor device;
   an internal control circuit (615) connected between said second output terminal (E) and said control input terminal (G);
   a turn-off circuit (616) connected between said output terminal (E) and the main gate ($g_m$) of said output-stage MOS semiconductor device;
   a gate resistance ($R_G$) connected between the main gate ($g_m$) of said output-stage MOS semiconductor device and said control input terminal (G); and
   wherein said depletion type MOS semiconductor device (608) is provided between said first output terminal (C) and the main gate ($g_m$) of said output-stage MOS semiconductor device, such that the collector electrode ($c_d$) of the depletion type MOS semiconductor device is coupled to said first output terminal (C), and
   wherein the gate electrode layer ($g_d$) of the depletion type MOS semiconductor device is connected to said control input terminal (G).

19. An apparatus as claimed in claim 1, further comprising:
   an output-stage MOS semiconductor device (603) including a control portion of a metal-oxide-semiconductor (MOS) structure that provides a main gate ($g_m$) as a control input port, a collector ($c_m$) as an output port, and a main emitter ($e_m$);
   first and second output terminals (C, E) connected to the collector ($c_m$) and the main emitter ($e_m$) of said output-stage semiconductor device;
   a control input terminal (G) connected to the main gate ($g_m$) of said output-stage semiconductor device;
   an internal control circuit connected between said second output terminal (E) and said control input terminal (G);
   a turn-off circuit connected between said output terminal (E) and the main gate ($g_m$) of said output-stage MOS semiconductor device;
   a gate resistance ($R_G$) connected between the main gate ($g_m$) of said output-stage MOS semiconductor device and said control input terminal (G); and
   wherein said depletion type MOS semiconductor device is connected in series with a Zener diode ($Z_{D2}$), a branch including the depletion type MOS semiconductor device and the Zener diode ($Z_{D2}$) being provided between said first output terminal (C) and the main gate ($g_m$) of said output-stage MOS semiconductor device, such that the collector electrode ($c_d$) of the depletion type MOS semiconductor device is coupled to said first output terminal (C), and such that an anode of the Zener diode ($Z_{D2}$) is connected to the emitter electrode ($e_d$) of the depletion type MOS semiconductor device, and wherein the gate electrode layer ($g_d$) of the depletion type MOS semiconductor device is connected to said control input terminal (G).

20. An apparatus according to claim 19, wherein said Zener diode ($Z_{D2}$) comprises a polysilicon layer that is insulated from a semiconductor substrate.

21. An apparatus according to claim 19, wherein said gate resistance ($R_G$) comprises a polysilicon layer that is insulated from a semiconductor substrate.

22. An apparatus according to claim 19, further comprising a Zener diode ($ZD_1$) and a resistance (Rz) that are connected in series, a branch including the Zener diode ($ZD_1$) and the resistance (Rz) being provided in parallel with said gate resistance ($R_G$), said Zener diode ($ZD_1$) having an anode electrode connected to said control input terminal (G), and a cathode electrode connected to the main gate ($g_m$) of said output-stage semiconductor device, and wherein said resistance (Rz) comprises a polysilicon layer that is insulated from a semiconductor substrate.

23. An apparatus as claimed in claim 1, further comprising:

an output-stage MOS semiconductor device including a control portion of a metal-oxide-semiconductor (MOS) structure that provides a main gate ($g_m$) as a control input port, a collector ($c_m$) as an output port, and a main emitter ($e_m$);

first and second output terminals (C, E) connected to the collector ($c_m$) and the main emitter ($e_m$) of said output-stage semiconductor device, respectively;

a control input terminal (G) connected to the main gate ($g_m$) of said output-stage semiconductor device;

an internal control circuit connected between said second output terminal (E) and said control input terminal (G);

a turn-off circuit connected between said output terminal (E) and the main gate ($g_m$) of said output-stage MOS semiconductor device; and a gate resistance ($R_G$) connected between the main gate ($g_m$) of said output-stage MOS semiconductor device and said control input terminal (G);

wherein said depletion type MOS semiconductor device is connected in series with a Zener diode ($ZD_2$) and a resistance ($R_{CG}$), a branch including the depletion type MOS semiconductor device, the Zener diode ($ZD_2$) and the resistance ($R_{CG}$) being provided between said first output terminal (C) and the main gate ($g_m$) of said output-stage MOS semiconductor device, such that the collector electrode ($c_d$) of the depletion type MOS semiconductor device is coupled to said first output terminal (C), and such that an anode of the Zener diode ($Z_{D2}$) is connected to the emitter electrode ($e_d$) of the depletion type MOS semiconductor device, and wherein the gate electrode layer ($g_d$) of the depletion type MOS semiconductor device is connected to said control input terminal (G).

24. An apparatus according to any one of claims 18 to 23, further comprising a Zener diode ($ZD_1$) that is arranged in parallel with said gate resistance ($R_G$), said Zener diode ($ZD_1$) having a cathode electrode connected to said control input terminal (G), and an anode electrode connected to the main gate ($g_m$) of said output-stage semiconductor device.

25. An apparatus according to any one of claims 18 to 23, further comprising a Zener diode ($ZD_1$) and a resistance (Rz) that are connected in series, a branch including the Zener diode ($ZD_1$) and the resistance (Rz) being provided in parallel with said gate resistance ($R_G$), said Zener diode ($ZD_1$) having an anode electrode connected to said control input terminal (G), and a cathode electrode connected to the main gate ($g_m$) of said output-stage semiconductor device.

26. An apparatus according to claim 23, wherein said gate resistance ($R_G$) comprises a polysilicon layer that is insulated from a semiconductor substrate.

27. An apparatus according to claim 23, further comprising a Zener diode ($ZD_1$) and a resistance (Rz) that are connected in series, a branch including the Zener diode ($ZD_1$) and the resistance (Rz) being provided in parallel with said gate resistance ($R_G$), said Zener diode ($ZD_1$) having an anode electrode connected to said control input terminal (G), and a cathode electrode connected to the main gate ($g_m$) of said output-stage semiconductor device, and wherein said resistance (Rz) comprises a polysilicon layer that is insulated from a semiconductor substrate.

28. An apparatus according to claim 1, further comprising:

an output-stage MOS semiconductor device including a control portion of a metal-oxide-semiconductor (MOS) structure that provides a main gate ($g_m$) as a control input port, a collector ($c_m$) as an output port, and a main emitter ($e_m$);

first and second output terminals (C, E) connected to the collector ($c_m$) and the main emitter ($e_m$) of said output-stage semiconductor device, respectively;

a control input terminal (G) connected to the main gate ($g_m$) of said output-stage semiconductor device;

a turn-off circuit (716) connected between said output terminal (E) and the main gate ($g_m$) of said output-stage MOS semiconductor device; and a gate resistance ($R_G$) connected between the main gate ($g_m$) of said output-stage MOS semiconductor device and said control input terminal (G);

wherein the collector electrode of said depletion type MOS semiconductor device is coupled to said first output terminal (C), and the emitter electrode of said depletion type MOS semiconductor device ($e_d$) is connected to a circuit power supply terminal ($V_{DD}$) of an internal control circuit.

29. An apparatus according to claim 1, further comprising:

an output-stage MOS semiconductor device including a control portion of a metal-oxide-semiconductor (MOS) structure that provides a main gate ($g_m$) as a control input port, a collector ($c_m$) as an output port, and a main emitter ($e_m$);

first and second output terminals (C, E) connected to the collector ($c_m$) and the main emitter ($e_m$) of said output-stage semiconductor device, respectively;

a control input terminal (G) connected to the main gate ($g_m$) of said output-stage semiconductor device;

a turn-off circuit (716) connected between said output terminal (E) and the main gate ($g_m$) of said output-stage MOS semiconductor device; and a gate resistance ($R_G$) connected between the main gate ($g_m$) of said output-stage MOS semiconductor device and said control input terminal (G);

wherein the collector electrode of said depletion type MOS semiconductor device is coupled to said first output terminal (C); and wherein a Zener diode ($ZD_3$) is provided having a cathode electrode connected to an emitter electrode ($e_d$) of said depletion type MOS semiconductor device, and an anode electrode connected to a circuit power supply terminal ($V_{DD}$) of an internal control circuit.

30. An apparatus according to claim 28 or 29, further comprising a Zener diode ($ZD_4$) having a cathode electrode connected to said control input terminal (G), and an anode electrode connected to the circuit power supply terminal ($V_{DD}$) of the internal control circuit.

31. An apparatus according to claim 1, further comprising:
    an output-stage MOS semiconductor device including a control portion of a metal-oxide-semiconductor (MOS) structure that provides a main gate ($g_m$) as a control input port, a collector ($c_m$) as an output port, and a main emitter ($e_m$);
    first and second output terminals (C, E) connected to the collector ($c_m$) and the main emitter ($e_m$) of said output-stage semiconductor device;
    a control input terminal (G) connected to the main gate ($g_m$) of said output-stage semiconductor device;
    an internal control circuit connected between said second output terminal (E) and said control input terminal (G), said internal control circuit including a voltage comparing terminal ($V_K$);
    a turn-off circuit connected between said second output terminal (E) and the main gate ($g_m$) of said output-stage MOS semiconductor device; and
    a gate resistance ($R_G$) connected between the main gate ($g_m$) of said output-stage MOS semiconductor device and said control input terminal (G);
    wherein the collector electrode of said depletion type MOS semiconductor device is connected to said first output terminal (C), and an emitter electrode of said depletion type MOS semiconductor device is connected to the voltage comparing terminal ($V_K$) of said internal control circuit.

32. An apparatus according to claim 1, further comprising:
    an output-stage MOS semiconductor device including a control portion of a metal-oxide-semiconductor (MOS) structure that provides a main gate ($g_m$) as a control input port, a collector ($c_m$) as an output port, and a main emitter ($e_m$);
    first and second output terminals (C, E) connected to the collector ($c_m$) and the main emitter ($e_m$) of said output-stage semiconductor device;
    a control input terminal (G) connected to the main gate ($g_m$) of said output-stage semiconductor device;
    an internal control circuit connected between said second output terminal (E) and said control input terminal (G), said internal control circuit including a voltage comparing terminal ($V_K$);
    a turn-off circuit connected between said second output terminal (E) and the main gate ($g_m$) of said output MOS semiconductor device; and
    a gate resistance ($R_G$) connected between the main gate ($g_m$) of said output-stage MOS semiconductor device and said control input terminal (G);
    wherein a collector electrode of said depletion type MOS semiconductor device is coupled to said first output terminal (C); and
    wherein a Zener diode ($ZD_5$) is provided having a cathode electrode connected to an emitter electrode ($e_d$) of said depletion type MOS semiconductor device, and an anode electrode connected to the voltage comparing terminal ($V_K$) of said internal control circuit.

33. An apparatus according to any one of claims 14, 15, 16, 18, 19, 22, 23, 29, 31 or 32, wherein said n⁻ depletion region of said depletion type MOS semiconductor device that is formed in a portion of said n⁻ drift layer that is surrounded by said p⁻ well region has a current density that does not exceed a current density of said output-stage semiconductor device.

34. An apparatus according to claim 1, further comprising:
    an output-stage MOS semiconductor device including a control portion of a metal-oxide-semiconductor (MOS) structure that provides a main gate ($g_m$) as a control input port, a collector ($c_m$) as an output port, and a main emitter ($e_m$);
    first and second output terminals (C, E) connected to the collector ($c_m$) and the main emitter ($e_m$) of said output-stage semiconductor device, respectively;
    a control input terminal (G) connected to the main gate ($g_m$) of said output-stage semiconductor device;
    a turn-off circuit (716) connected between said output terminal (E) and the main gate ($g_m$) of said output-stage MOS semiconductor device;
    a gate resistance ($R_G$) connected between the main gate ($g_m$) of said output-stage MOS semiconductor device and said control input terminal (G); and
    a Zener diode ($ZD_4$) having a cathode electrode connected to said control input terminal (G), and an anode electrode connected to the circuit power supply terminal ($V_{DD}$) of the internal control circuit,
    wherein the collector electrode of said depletion type MOS semiconductor device is coupled to said first output terminal (C), and the emitter electrode of said depletion type MOS semiconductor device ($e_d$) is connected to a circuit power supply terminal ($V_{DD}$) of an internal control circuit.

* * * * *

UNITED STATES PATENT AND TRADEMARK OFFICE
CERTIFICATE OF CORRECTION

PATENT NO.     : 6,528,826 B2
DATED          : March 4, 2003
INVENTOR(S)    : Kazuhiko Yoshida et al.

It is certified that error appears in the above-identified patent and that said Letters Patent is hereby corrected as shown below:

<u>Title page,</u>
Item [75], Inventors, please change third inventor's last name "Fijihira" to
-- Fujihira --.

Signed and Sealed this

Fifteenth Day of July, 2003

JAMES E. ROGAN
*Director of the United States Patent and Trademark Office*